(12) United States Patent
Gaynes et al.

(10) Patent No.: US 6,187,678 B1
(45) Date of Patent: Feb. 13, 2001

(54) HIGH DENSITY INTEGRATED CIRCUIT PACKAGING WITH CHIP STACKING AND VIA INTERCONNECTIONS

(75) Inventors: Michael Anthony Gaynes, Vestal, NY (US); Alan James Emerick, Warren Center, PA (US); Viswanadham Puligandla, Lewisville, TX (US); Charles Gerard Woychik, Vestal, NY (US); Jerzy Maria Zalesinski, Essex Junction, VT (US)

(73) Assignee: International Business Machines Corporation, Armonk, NY (US)

(*) Notice: Under 35 U.S.C. 154(b), the term of this patent shall be extended for 0 days.

(21) Appl. No.: 09/379,716

(22) Filed: Aug. 24, 1999

Related U.S. Application Data

(62) Division of application No. 08/578,922, filed on Dec. 27, 1995, now Pat. No. 6,002,177.

(51) Int. Cl.[7] .................................................. H01L 21/44
(52) U.S. Cl. .......................... 438/667; 438/559; 438/624
(58) Field of Search ..................................... 438/667, 479, 438/624, 462, 439, 460, 559; 156/643, 656; 216/13, 95; 437/208, 686

(56) References Cited

U.S. PATENT DOCUMENTS

| | | | |
|---|---|---|---|
| 3,615,943 | * 10/1971 | Genser | 438/559 |
| 4,348,253 | * 9/1982 | Subbarao et al. | 156/643 |
| 4,394,712 | 7/1983 | Anthony | 361/779 |
| 4,437,109 | 3/1984 | Anthony et al. | 257/507 |
| 4,499,655 | 2/1985 | Anthony | 438/109 |
| 4,754,316 | 6/1988 | Reid | 257/777 |
| 4,761,681 | * 8/1988 | Reid | 357/68 |

(List continued on next page.)

FOREIGN PATENT DOCUMENTS 5029537  5/1993 (JP).

OTHER PUBLICATIONS

B. Arnold; "Cost and Pin Counts Rise in Shift to SMT"; PTS 941103617; Electronic Buyer's News; Feb. 21, 1994; p. 24.

T. Costlow; "Good Die, 3–D Highland Confab"; PTS 941103458; Electronic Engineering Times; Feb. 21, 1994; p. 77.

*Primary Examiner*—David Nelms
*Assistant Examiner*—Phuc T. Dang
(74) *Attorney, Agent, or Firm*—McGuireWoods, LLP; Ronald A. Kaschak

(57) ABSTRACT

Chip stacks with decreased conductor length and improved noise immunity are formed by laser drilling of individual chips, such as memory chips, preferably near but within the periphery thereof, and forming conductors therethrough, preferably by metallization or filling with conductive paste which may be stabilized by transient liquid phase (TLP) processes and preferably with or during metallization of conductive pads, possibly including connector patterns on both sides of at least some of the chips in the stack. At least some of the chips in the stack then have electrical and mechanical connections made therebetween, preferably with electroplated solder preforms consistent with TLP processes. The connections may be contained by a layer of resilient material surrounding the connections and which may be formed in-situ. High density circuit packages thus obtained may be mounted on a carrier by surface mount techniques or separable connectors such as a plug and socket arrangement. The carrier may be of the same material as the chip stacks to match coefficients of thermal expansion. High-density circuit packages may also be in the form of removable memory modules in generally planar or prism shaped form similar to a pen or as a thermal conduction module.

16 Claims, 16 Drawing Sheets

U.S. PATENT DOCUMENTS

| | | | |
|---|---|---|---|
| 4,841,355 | 6/1989 | Parks | 257/686 |
| 4,939,568 | 7/1990 | Kato et al. | 257/686 |
| 4,984,358 | 1/1991 | Nelson | 438/109 |
| 4,991,000 | 2/1991 | Bone et al. | 257/686 |
| 5,032,896 | 7/1991 | Little et al. | 257/686 |
| 5,191,405 | 3/1993 | Tomita et al. | 257/777 |
| 5,202,754 | 4/1993 | Bertin et al. | 257/684 |
| 5,229,647 | 7/1993 | Gnadinger | 257/785 |
| 5,270,261 | 12/1993 | Bertin et al. | 438/109 |
| 5,399,898 | 3/1995 | Rostoker | 257/499 |
| 5,404,044 | 4/1995 | Booth et al. | 257/698 |
| 5,408,123 | 4/1995 | Murai | 257/531 |
| 5,455,445 | 10/1995 | Kurtz et al. | 257/419 |
| 5,492,235 * | 2/1996 | Crafts et al. | 216/13 |
| 5,510,655 | 4/1996 | Tanielian | 257/774 |
| 5,528,080 | 6/1996 | Goldstein | 257/741 |
| 5,530,288 | 6/1996 | Stone | 257/700 |
| 5,552,633 | 9/1996 | Sharma | 257/700 |
| 5,608,264 | 3/1997 | Gaul | 257/734 |
| 5,637,925 | 6/1997 | Ludden et al. | 257/774 |
| 5,702,984 * | 12/1997 | Bertin et al. | 437/208 |
| 5,859,470 | 1/1999 | Ellerson et al. | 257/772 |

* cited by examiner

HIGH DENSITY INTEGRATED CIRCUIT PACKAGING WITH CHIP STACKING AND VIA INTERCONNECTIONS

This application is a divisional of U.S. patent application Ser. No. 08/578,922, now U.S. Pat. No. 6,002,177, filed Dec. 27, 1995 the contents of which is hereby incorporated by reference.

BACKGROUND OF THE INVENTION

1. Field of the Invention

The present invention generally relates to interconnection and packaging of integrated circuits and, more particularly, to high integration and packaging density and high performance integrated circuits, especially high capacity integrated circuit memories having improved noise immunity.

Description of the Prior Art

2. It has been long recognized that reduction in size of integrated circuits can provide numerous performance enhancements of the circuits produced as well as substantial economies in the manufacture thereof. In fact, at the present time, the operational speed of digital systems, sub-systems and circuits and elements thereof is often effectively limited by the time required for signal propagation over conductors interconnecting them and the individual circuit elements thereof, particularly because of the resistance and parasitic capacitances of the interconnections. Further, elongated and/or tortuously routed connections, unless well-supported such as by encapsulation or lamination may decrease manufacturing yield, if imperfectly formed, or may cause increased susceptibility to damage through vibration, shock, thermal excursions or cycling and other environmental effects and conditions after an integrated circuit or modular package containing a plurality of integrated circuits is placed in service.

To provide potentially complex connections between potentially large numbers of individual integrated circuit chips (which may also be formed with diverse and mutually incompatible processes, while answering the above concerns to a substantial degree) so-called multi-layer modules (MLMs) have become known and highly developed as a packaging structure for highly complex and high performance electronic circuits.

Such modular packages have a complex array of connections made by patterns of conductors on the surfaces of each of a plurality of individual lamina (e.g. in ceramic structures the uncured ceramic lamina are referred to as "green sheets" with patterns formed thereon by conductive paste extruded thereon through a mask) which are then laminated together into a unitary structure with the conductive patterns embedded therein. Connections through lamina from one conductor pattern to another are generally accomplished by extruding the same conductive paste into holes or "vias" in the lamina although other materials and techniques, such as embedding conductive spheres and/or pins in the lamina, are known and can be used. Integrated circuits and connection structures (e.g. pins) are then mounted on respective surfaces thereof and the completed device with integrated circuits thereon is encapsulated to complete the device package.

Integrated circuit chips are generally mounted in a single layer modular circuit packages or devices and other structures, such as printed circuit boards, using so-called surface mount technology (SMT) in which connection pads on chips are soldered, using any of a plurality of techniques of solder application, to corresponding pads on the surface of a carrier, such as an MLM or circuit board. To save space and reduce length of some connections, it is known to mount one integrated circuit chip over another chip (generally of a similar type, such as memory chips) by commonly connected lead frames which, in turn, make connections to pads on each chip. In such arrangements, however, the connection path is not optimal since connections to each chip, which may in some cases be made in several layers, extend to and from a distance beyond the edge of the chip due to the use of a lead frame structure. However, since common connections are most often required to similar locations on each chip, such a structure results in additional conduction path length with attendant performance limitations and exposure to electrical noise.

Since the lead frame consumes additional space on the surface of the carrier, there is also a limitation on integrated circuit packing density due to the lead frame even when several circuits are stacked. Further, attachment of the lead frame to the chips and attaching the lead frames together and to the supporting structure, such as an MLM, may adversely affect manufacturing yield. Encapsulation of the lead frame may also be imperfect, compromising resistance of the overall circuit to damage from vibration, thermal effects and the like, mentioned above. Additionally, the extended conductors inherent in a lead frame cannot be effectively shielded and are therefore subject to electrical noise.

In summary, while interconnection techniques have become highly advanced and reliable and have supported significant performance increases, they are inherently not optimized and continue to impose limits on electrical performance, circuit durability and reliability, circuit density and manufacturing yield. Further, the use of lead frames and the manipulations thereof as well as attachment of lead frames to form common connections and encapsulation processes necessitated when chips are stacked are costly and contribute significantly to the total cost of the package.

At least since the development of the personal computer, it has been considered desirable to provide removable and interchangeable memory structures such as so-called floppy disks. Interchangeability of memory structures enables reduction of the amount of data and applications programs which are resident on the machine itself and allows portability of data between machines without a requirement for networking or other communication facilities. The reduction of size of floppy disks to sizes which may be carried in a user's pocket has been found to be an extremely convenient attribute. Removability provides security of data and/or application programs from corruption in the event of system malfunction such as in familiar back-up duplication of files and logging for archival storage of the state of data at particular points in time. Additional security is also possible since removable storage media may be conveniently stored under high security conditions (e.g. in a safe) without the need to secure the entire machine or system. Other security facilities, such as passwords, may be made specific to individual storage media or files to further limit access to data and/or programs stored thereon.

While these functions are most often accomplished (at least for personal computers) by so-called floppy disks, drives for these disks are slow and storage capacity of the floppy disks is limited although substantial gains have been made in both speed of access and storage capacity in recent years. Alternative storage media having higher performance are known but are generally less convenient or considerably more expensive to the point of impracticality for most personal computer applications and users. Removal and substitution of circuit boards containing non-volatile storage is an appropriate example since non-volatile memory is extremely expensive and/or requires a self-contained power supply. Circuit boards are difficult to install and remove from the computer and arrangements increasing the convenience of doing so may compromise the reliability of connections thereto when numerous insertions and removals of the memory structure are contemplated. Further, when not installed in the computer, the contacts must be physically protected in a manner which is convenient and natural to the user.

Nevertheless, solid state memory in the form of interchangeable, plug-in memory cards is being increasingly used in mobile and portable computing architectures which have additional security and environmental (e.g. temperature, moisture, etc.) concerns. Current technology for these devices utilizes Thin Small outline Packages (TSOP) for the chips mounted on 15–20 mil thick glass epoxy laminate boards with low stand-off distances. The boards are then encased in a plastic frame with a metallic cover. These structures, however, are subject to numerous problems at the present state of the art.

Specifically, memory modules having such a structure have a large chip to plastic ratio if of high storage capacity. The coefficient of thermal expansion of the chips is generally incompatible with the carrier material which places stresses on the solder chip-to-carrier connections and leads to solder joint reliability problems. The low stand-off height compromises cleanability, secondary solder reflow and difficulty in rework of the boards. Further, the structure is not robust and must be protected against temperature extremes, moisture, shock, bending (since the package is of a relatively thin design for purposes of convenience), and the like. Moisture induced cracking of the packages has been a particularly severe problem. Additionally, the amount of memory which can be provided on a card of convenient size is limited to about eight megabytes at the present time.

Between these two extremes, the so-called Bernoulli Box, which achieved a degree of popularity about ten years ago, provided storage capacity and access time comparable to then-available hard disks although the removable storage media was substantially larger than floppy disks. At present, however, it does not appear that magnetic storage media will allow significant further increases in either access time or storage capacity which can match the processing capabilities of modern processors. Therefore, other media such as "write-once CD" media are being explored for such purposes as the floppy disk is now used. However, at the present state of the art, alternative media appear to have inherent attributes which render them less than optimally convenient, such as cost or, in the case of the "write-once CD", the fact that data, once written, may not be changed and thus the storage capacity is diminished by disabling a file each time the file is stored by being written to a new area of the medium.

Accordingly, there is a need in the art for a structure for mounting integrated circuits on carriers which both reduces the effective total footprint of the integrated circuits so mounted and improves functional performance, structural robustness and susceptibility to noise. This need is particularly acute for memory structures. By the same token, there is a need for increased amounts of storage which can be rapidly accessed in packages which are conveniently removable from and replaceable in a processor while maintaining reliability comparable to floppy disks. Since the latter need cannot seemingly be met by static storage devices such as non-volatile storage devices (e.g. EEPROMs) and optical and magnetic storage media, active storage devices may afford a solution if issues of carrier size, structural robustness, noise susceptibility and stand-by power can be solved in regard to mounting of integrated circuits. The present invention thus addresses these needs both separately and concurrently.

SUMMARY OF THE INVENTION

It is therefore an object of the present invention to provide a methodology and structure allowing the stacking of integrated circuit chips which provides reduced length of conductors and increased circuit integration density and compactness.

It is another object of the invention to provide a methodology and structure for the stacking of integrated circuit chips having reduced connections exposure to electrical noise.

It is a further object of the invention to provide a conveniently removable and interchangeable memory structure of high capacity and fast access speed suitable for packaging in a variety of generalized configurations, including sizes and shapes which may be conveniently carried in a pocket of a garment.

It is yet another object of the invention to provide improved forms and methodologies of electronic integrated circuit packaging of improved reliability, electrical performance and noise immunity and increased compactness.

In order to accomplish these and other objects of the invention, there is provided herein a methodology for enabling chip circuits to be stacked one upon the other with minimal separation between them and allowing inter-chip connectivity potentially over the entire surface of the chips so that connection paths between circuit elements on different chips in a stack and noise susceptibility of such connections can be minimized while increasing the robustness of the structure and the ease with which it can be fabricated. The methodology couples techniques for precise laser drilling of small holes with techniques for making these holes conductive, metallizing small chip surface areas, applying conductive structures to the chip surface and using these conductive structures to join chips such that chip layers may be mechanically and electrically connected in very high density stacks having an enhanced durability, noise immunity and electrical performance. These qualities and meritorious effects of the invention, in turn, facilitate inclusion of the stacks in a wide variety of configurations optimally suited to the packaging requirements of consumers and processing equipment designers.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
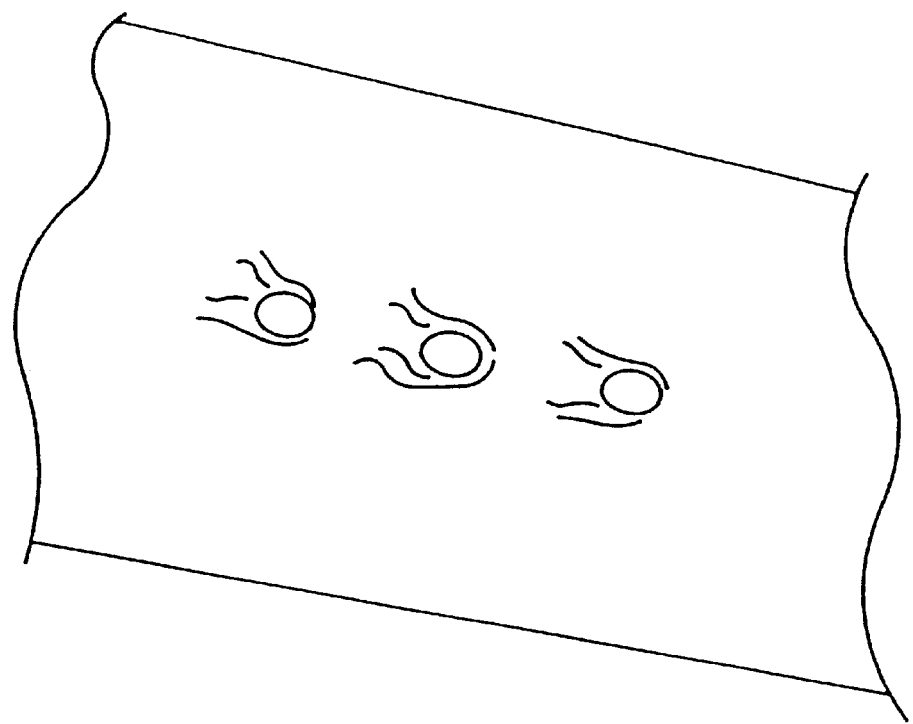
FIGS. 1 and 2 are highly magnified (approximately 100×) plan and section images, respectively, of through holes formed by laser through a silicon chip.
Figure 2:
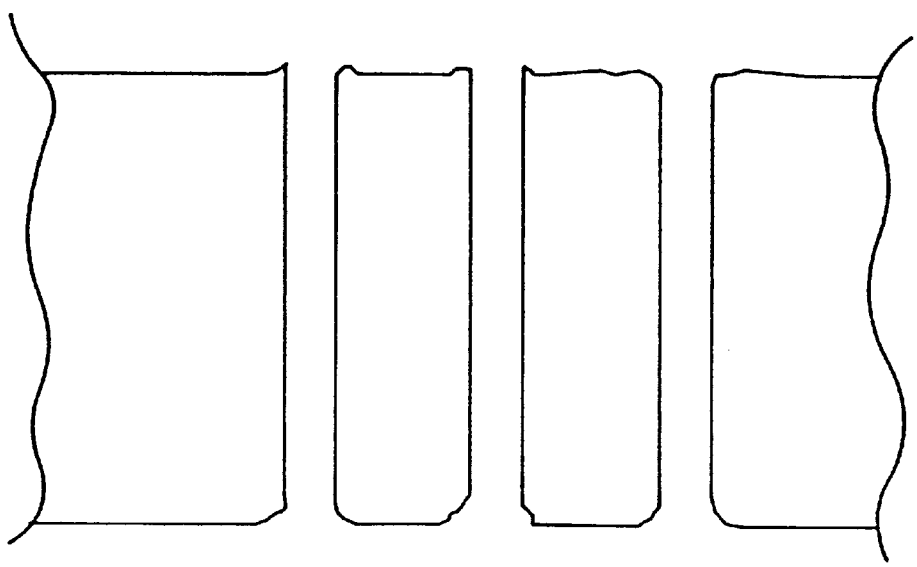

Referring now to the drawings, and more particularly to FIG. 1, there is shown a much enlarged image of an array of holes ablated in a silicon chip by use of a laser. Each of these holes has a diameter of approximately 0.003 inches and are preferably achieved by a XeCl excimer laser emitting a wavelength of 308 nm with a pulse width (FWHM) of 25 nsec with a uniform intensity profile developed by use of a beam homogenizer of a commercially available type and the enlarged beam from the beam homogenizer passed through 10× reducing optics. Beam fluence of 17–30 J/cm$^2$ for 20–30 seconds at a pulse rate of approximately 200 pulses per second is suitable for achieving the holes depicted. Alternative techniques such as lithographic patterning and etching could potentially be used either alone or in combination with laser ablation. However, etching is limited to moderate depth to diameter ratios and generally results in some degree of tapering of the holes, resulting in a generally conical shape of the aperture. Laser drilling is considered to be preferable for these reasons. On-center spacing of the holes in FIG. 1 is approximately four times the hole diameter. However, as can be seen in FIG. 2, the holes formed by laser drilling are very close to ideally cylindrical and closer spacing is possible.

Figure 3:
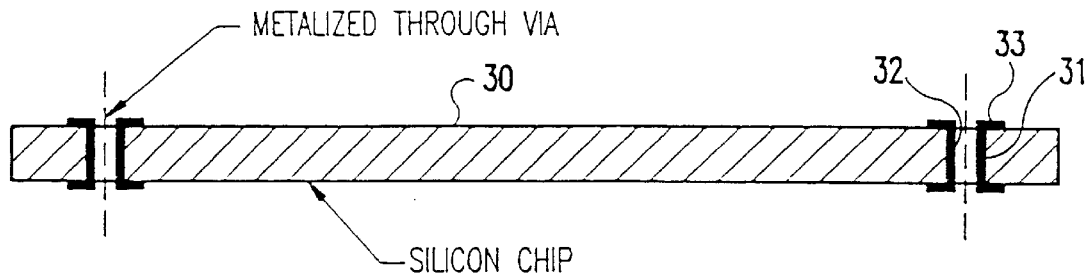
FIG. 3 is a cross-section of a semiconductor chip having metallized through holes at edges thereof in accordance with the invention.

As shown in FIG. 3, these through holes 31 are preferably formed on the edge of chip 30 since they are relatively large in comparison with transistors, connections and other electrical components which may be formed on the chip and may cause increased complexity of layout design or connectors of greater than optimal length if formed at interior locations on the chip. However, it is to be understood that there is no inherent limitation on the location on the chip where holes may be formed if an interior location, for example, was found to be convenient or necessary as a feature of the overall chip layout or package design. Likewise, while it is considered preferable that the holes be formed approximately perpendicular to a surface of a wafer, chip or carrier, there is no inherent limitation thereon and angled vias, possibly for adjusting connection locations between chip or carrier surfaces, can be readily formed by laser drilling (but not by etching) and laser drilling is preferred for this reason, as well.

It should also be understood that the wafer chip or carrier need not be of a single material. For example, laser drilling can be done after formation of electronic components or connections on the wafer or chip and generally without significant impact on the heat budget of any such devices if the locations are suitably separated. Some provision for reducing reflection from metal should be provided if laser drilling is to be performed through a metal conductor. Similarly, the wafer, chip or carrier may be a layered structure, such as silicon on insulator (SOI) with a semiconductor surface provided for the formation of electronic componenets either before or after laser drilling.

Hole locations are therefore set in accordance with the interconnection requirements of the overall design of the multi-chip stack. In the simplest stack design, all chips in the stack would be the same and could be supplied from the yield of a production run of the same wafer type. In general, however, a stack may be formed from chips having different chip designs having differing functions and which form respective components of an overall stack design. It should be noted that higher yield rates and therefore reduced cost may be consequent upon a three dimensional stack design involving multiple chip layers in contrast to conventional integration of the same circuitry onto a single chip layer. That is, a stack of smaller chips has a much reduced footprint and smaller chips will usually provide increased manufacturing yield. Testing of smaller chips is also far easier and allows defective chips to be physically omitted whereas redundant circuits and custom wiring (e.g. programmable fuses) are required to attain acceptable yield in larger chips. The invention may also be considered as allowing exploitation of the easier testing of less complex chips while avoiding the space and noise complications of interconnecting them while allowing greater manufacturing yield expected of chips having reduced complexity and element count over the area thereof.

It should also be noted that a three dimensional stack offers an additional degree of freedom for the designer in laying out circuit elements on chips so as to minimize the length of interconnecting conductors. Under the single layer approach to circuit component layout, the length of interconnecting conductors is constrained by the two degrees of freedom available within the layer, even where MLMs are used to minimize length within those two degrees of freedom. The chip stack provides a third degree of freedom for chip component layout, enabling a more compact design of the overall package. Connections may be provided by conductors having substantial vertical as well as horizontal segments. It is often the case that a relatively small increase in length of conductor in the vertical direction can avoid much longer routing of conductors if principally confined to a small number of levels.

In general, the design may encompass an ordered plurality of chips, each having a layout of circuit components and conductors and occupying a particular vertical layer within a stack, including any additional conductive layers on a chip surface. Further, in general, each chip may be different and the design may contemplate a particular ordering of the different layers; the layout and continuity of conductors in the vertical dimension will require that the vertically interconnecting conductors on adjoining chip surfaces match one another at appropriate points, so that the vertical interconnection points on a chip surface will be a mirror image of corresponding vertical interconnection points on the adjoining chip surface.

Figure 20:
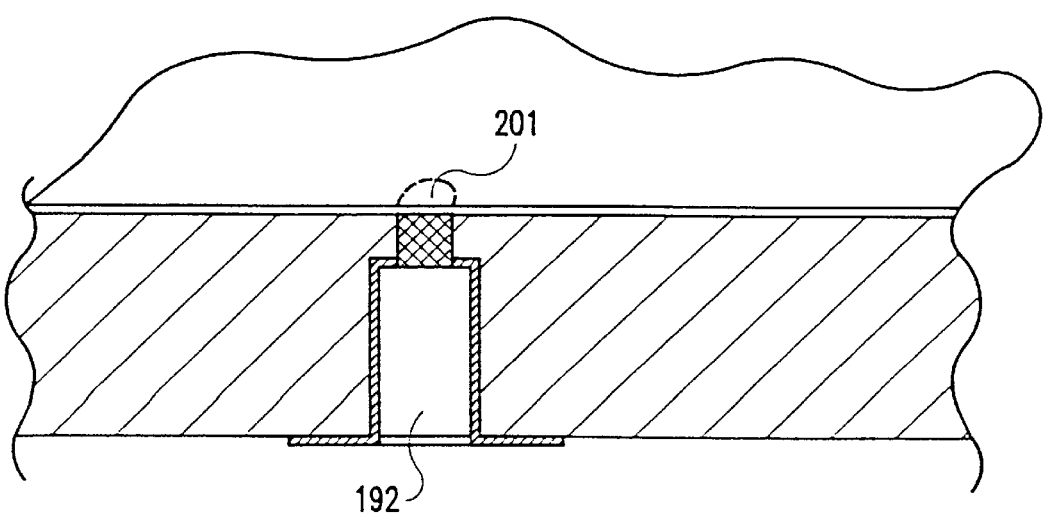
FIG. 20 shows a doped region of a chip extending to a via well.
Figure 21:
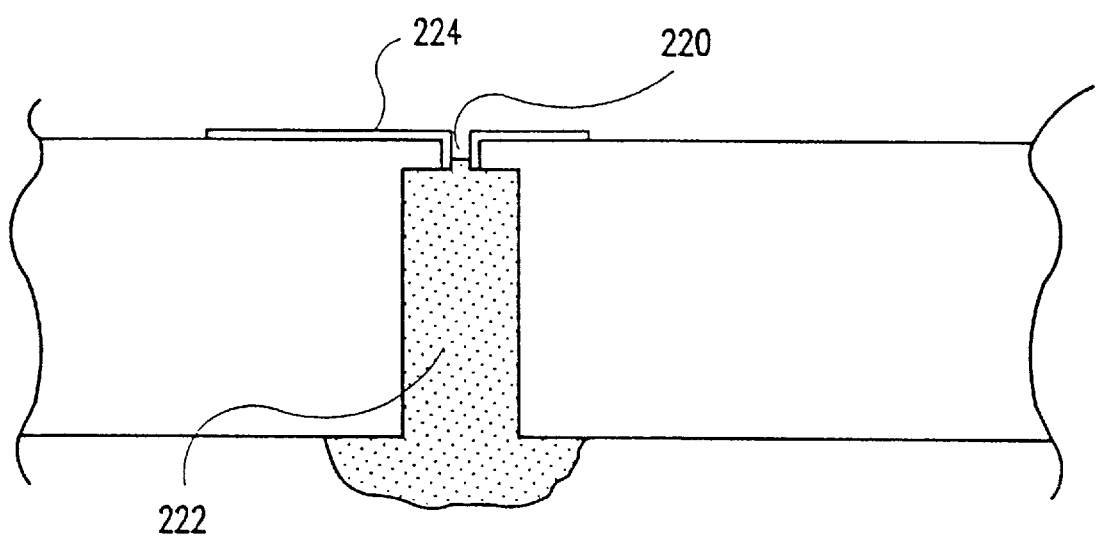
FIG. 21 shows a microhole extending to a via well.

Drilling of the holes 31 may be accomplished in a variety of ways compatible with the other steps in the manufacturing process. In one embodiment the holes may be drilled on a first wafer surface through to the other side, after having coated the first surface with a protective photoresist in preparation for subsequent formation of circuits on the surface of the wafer. Alternatively, a passivation layer may be applied as a protective coating after formation of electronic components and/or connection structures on a surface of the wafer over which connections can be formed, if desired, in a manner well-understood in the art. In another embodiment, laser drilling of the holes 31 is accomplished by drilling holes less than 75 microns in diameter from one side of the wafer partially through the wafer, and then drilling openings or wells from the other side centered on the same axis but of, for example, twice that diameter to a depth such that the wells and holes intersect, such as is shown in FIGS. 20 and 21. For a given hole, the larger diameter well may be on either side of the wafer and is in the nature of a countersink to provide a convenient pocket for later formation of raised deposits from adhesive or paste material (as described hereafter in connection with FIG. 6), or for application of solder preforms implementing controlled collapse chip connect (or so-called "C4") technology. The surfaces of the wafer are then preferably exposed to agitated deionized water to clean off the debris deposited during drilling. Laser drilling may also be accomplished with the support of optics which split the beam to drill a plurality of holes simultaneously. This technique has the advantage of reducing the number of separate positions of the laser drill which must be registered and aligned.

Figure 22:
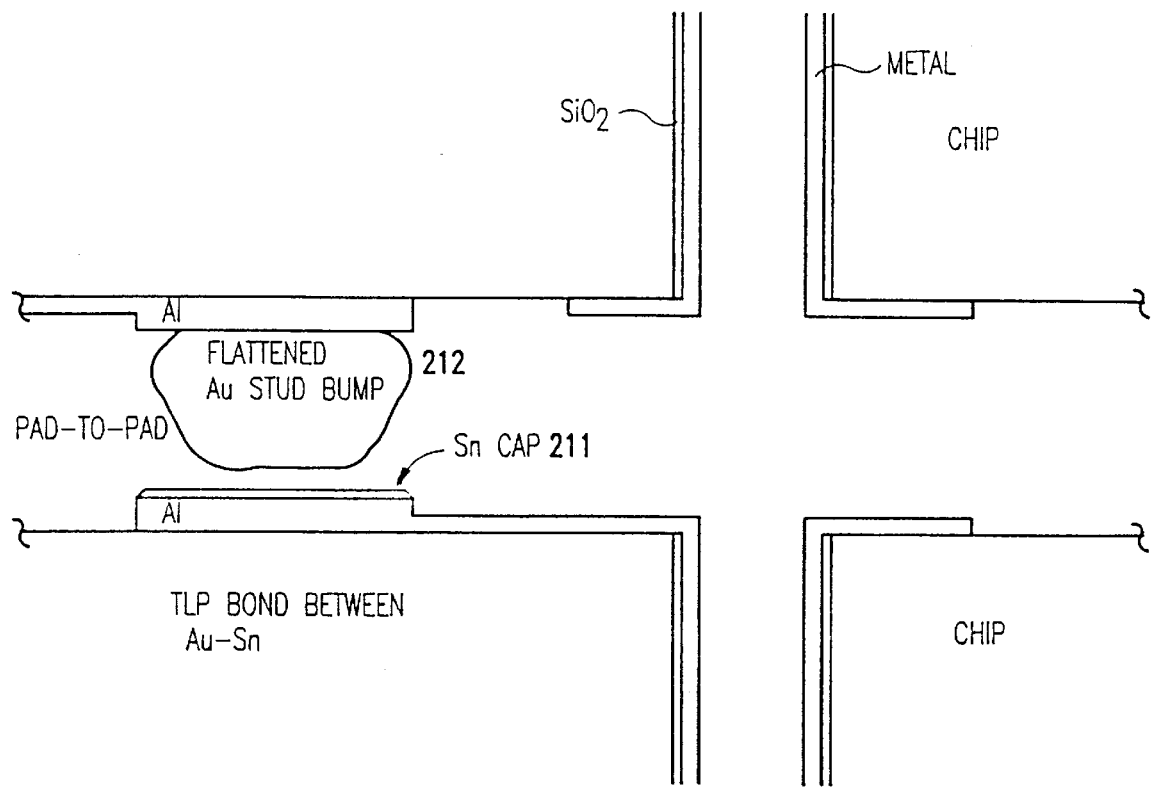
FIG. 22 shows a gold bump on an aluminum pad aligned with a tin capped pad prior to joining by a transient liquid phase (TLP) process.

An exemplary metallization 32 of the through holes 31 to form an electrical connection between sides of the chip is included in the illustration of FIG. 3. Such metallization can be accomplished in a number of ways including plating, evaporation and sputtering. For example, a thin coating of solder wettable metal can be deposited on the interior walls of the holes, and then the holes may be filled at least partially with molten solder by capillary action, pressure or vacuum. In another metallization embodiment, successive layers of aluminum, copper and chromium are applied by deposition (e.g. sputtering, evaporation, electroplating, etc.) on one or both sides of the wafer, followed by photolithographic removal of these layers except at the holes and at such other locations where connective pads are called for in the stack design. In another embodiment, shown in FIG. 21, conforming to the above example of drilling different diameter wells on either side of the wafer, the smaller diameter wells 220 may be doped to provide electrical conduction, while the larger diameter wells 222 are filled with an electrically conductive adhesive such as a paste having transient liquid phase (TLP) properties, such as tin coated copper particles mixed with a dielectric thermoplastic adhesive. Other TLP metallurgical systems include but are not limited to indium and/or tin coatings of lead, gold, copper and/or silver particles or lead, gold, copper or silver coatings on tin or indium particles or particles of tin and/or indium mixed with particles of of lead, gold, copper and/or silver mixed in a ratio of weight and size to form a TLP alloy system. An exemplary gold bump 212 on an aluminum pad on a first chip or carrier facing a tin covered aluminum pad 211 on another chip or carrier and ready for joining thereto is illustrated in FIG. 22. The formation of the respective materials will generally be dictated by the materials chosen and it is not necessary that both be of a significantly protruding form but only that the surfaces to be joined can be brought into contact during the TLP process. However, suitable electrical connections need not be formed by metallization but can be accomplished in a number of ways including filling the through holes 31 with conductive paste.

Figure 4:
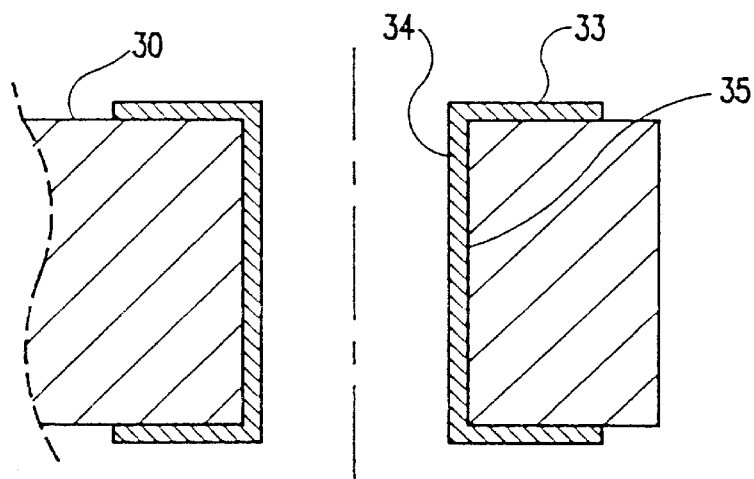
FIG. 4 is a magnified cross-section of a metallized through hole of FIG. 3.
Figure 5:
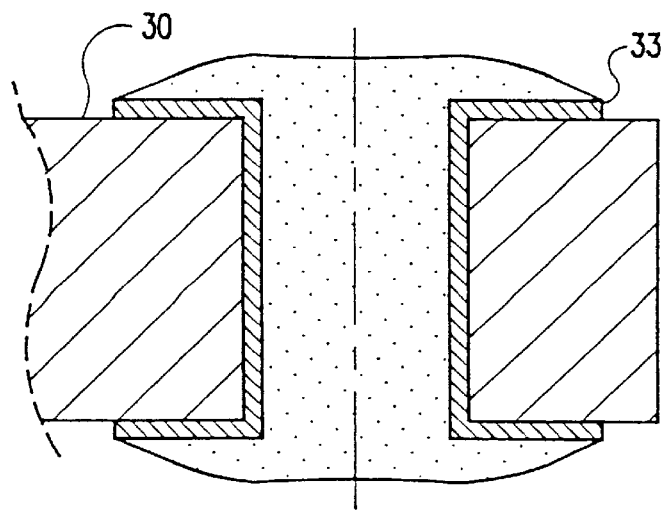
FIG. 5 shows a completed chip via filled with conductive material in accordance with the invention.

In any event, it is considered preferable to provide metallization 33 in a form having a flange at the periphery of the through holes 31 on the chip surface 30 as shown in FIGS. 3, 4 and 5. This flange facilitates the formation of on-chip and chip-to-chip connections as will be discussed in greater detail below.

As shown in FIG. 4, where the connection between sides of the chip is formed by metallization, any of the above exemplary techniques will form a deposit of metal 34 in the interior surface 35 of the through hole concurrently with surface deposits 33. While aluminum is preferred for metallization, other metals such as gold, silver and copper can be used, as described above. Further, plural layers of different metals (e.g. noble metals, chromium, nickel, etc.) can be used to achieve desired qualities of strength, adhesion, conductivity and the like, as is well-understood in the art in other integrated circuit connection structures. Additionally, different metals or layered combinations or alloys can be used for the through hole deposit 32 and the surface deposit 33 by known techniques, The extent of surface deposits 33 may be established by masking prior to metal deposition or patterned by etching or other processes after deposition by any technique. Such metallization may also be done to form pads which need not be associated with through holes or vias in the same or different steps. Neither procedure is at all critical to the practice of the invention. Similarly, as will be recognized by those skilled in the art, surface deposits 33 should be sized to accommodate registration tolerances when chip-to-chip connections are made as well as the limits of accuracy of location of the through holes 31. Accuracy of location may also be affected by thermal expansion.

As shown in FIG. 5, connection between metallization on chip surfaces can also be made by filling the vias or through holes 31 with a conductive paste which should preferably overlay at least a portion of the surface metal deposits 33, as shown. Such filling can also be advantageously used together with the through hole metallization illustrated in FIG. 4 to increase current-carrying capability and reduce resistance of the connection. In this case, the filling of the through hole with paste will also serve to stabilize the metallization 34 and reduce adhesion requirements between the metal and the chip material. Of course, if only the latter effect of mechanical stabilization of the metallization is required, the paste need not be conductive or overlay the surface deposits in the manner shown in FIG. 5.

Chip-to-chip interconnective supports can also be made in numerous ways including the use of similar conductive pastes (which may or may not be additionally stabilized by heat treatments which alter the electrical and/or mechanical properties thereof) of either metallic particles therein or the binder material or both, such as transient liquid phase soldering between conductive particles), soldering (such as with electroplated solder deposits or C4 solder preforms or the like) or with pad-on-pad metallurgical processes such as dendritic connectors as described in U.S. Pat. No. 5,137,461, incorporated herein by reference in its entirety. By way of example and not limitation, solder (e.g. 97/3 Pb/Sn) may be dry deposited and photolithographically removed leaving solder extending over the edge of pads selected in accordance with the design of the stack, which solder depositions are then reflowed to form solder bumps on the selected pads.

Conductive paste can also be advantageously confined in vias in a thin insulative (e.g. polymer) sheet which may have some degree of elasticity. Such a sheet is illustrated at 132 of FIG. 13A and may be formed in-situ by flowing insulative material around connections. While dimensional changes due to thermal expansion are generally small due to the similar materials of which the chips are fabricated and good thermal communication between stacked chips, it is possible that adjacent chips may achieve substantially different temperatures from time to time. Thus, the elasticity of intervening insulative sheet having vias for confining conductive paste or solder can accommodate different degrees of thermal expansion in adjacent chips as well as provide improved resistance to damage from accelerations such as vibration or even solder reflow if chip temperatures cause softening or melting of solder. If preformed insulative sheets having vias are employed, it should be recognized that either or both sides (or even the interior of the sheet) can have connections formed between vias and/or pads formed thereon with conductive paste or patterned metall-ization or the like in the same manner as the chips.

So-called transient liquid phase (TLP) metallurgical processes, alluded to above, are characterized by partial liquefaction of conductive metals occurring, with heating, at an interface between alloying metals which, beginning with a eutectic alloy, mix and solidify as the composition of the alloy changes, simultaneously raising the melting point of the alloy as the materials mix and the alloy composition is altered. TLP connections are thus preferred for chip-to-chip connections (or connection to intervening insulative sheets, as described above). TLP processes (which can also be employed in the stabilization of a conductive paste, as noted above) are preferred since a high-quality and highly reliable connection can be made with a relatively small temperature excursion above the eutectic alloy melting point while the liquid phase is adequately "transient" such that displacement of metal in the connection can be avoided and the connections can thus be formed at very high density. It should also be noted that use of TLP techniques to stabilize a conductive paste in the through-holes, such as is shown in FIG. 5 can simultaneously (or in separate process steps) form chip-to-chip connections in which a continuous matrix of fused metal particles will be developed both within and between chips.

Figure 6:
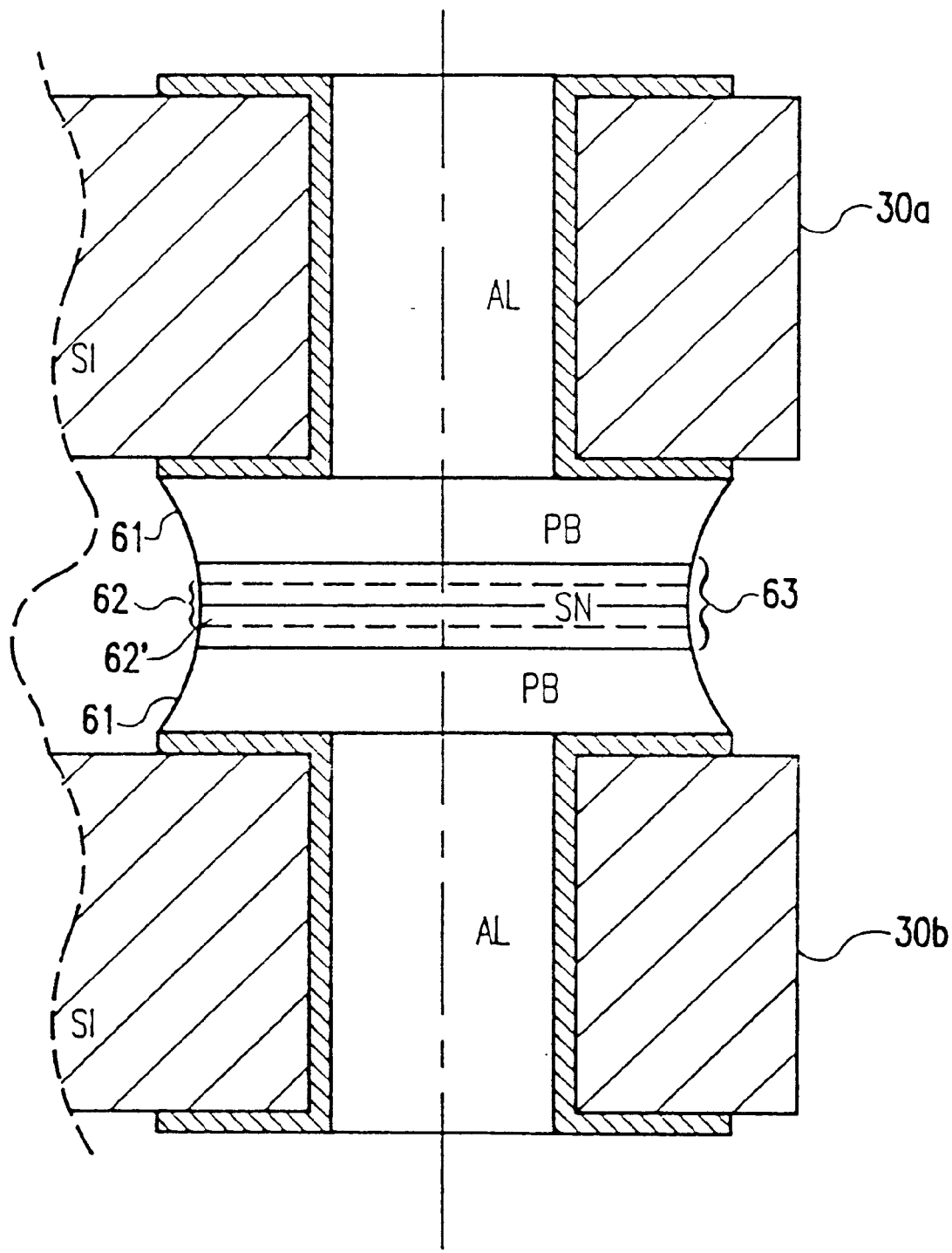
FIG. 6 shows an enlarged connection between chip vias on two stacked chips in accordance with the invention.

Referring now to FIG. 6, a TLP connection made between vias is shown. A preform or electroplated deposit 61 is placed or formed at the vias on facing sides of chips 30A, 30B, to be connected. The preform or deposit includes a layer of a first metal such as-lead and one or both preforms or deposits include a further layer 62 or 62' of at least a second alloying metal such as tin. As the temperature is raised toward the melting point of the lower melting point metal, the metals will form a solution of eutectic alloy having a reduced melting point over a region corresponding in volume to the amount of solute metal until all available amounts of the second metal is dissolved. As further amounts of the first metal enter the solution, however, the composition of the alloy changes and the melting point of the alloy rises; causing the alloy to solidify over region 63, forming a connection. Connections formed in this way are particularly reliable since, if temperature is properly controlled, the process is self-limiting and only occurs where alloying can take place. The volume of material in the liquid phase is limited to a small volume region at the interface of the different metals and displacement of material, if it occurs at all, is extremely small.

Figure 7:
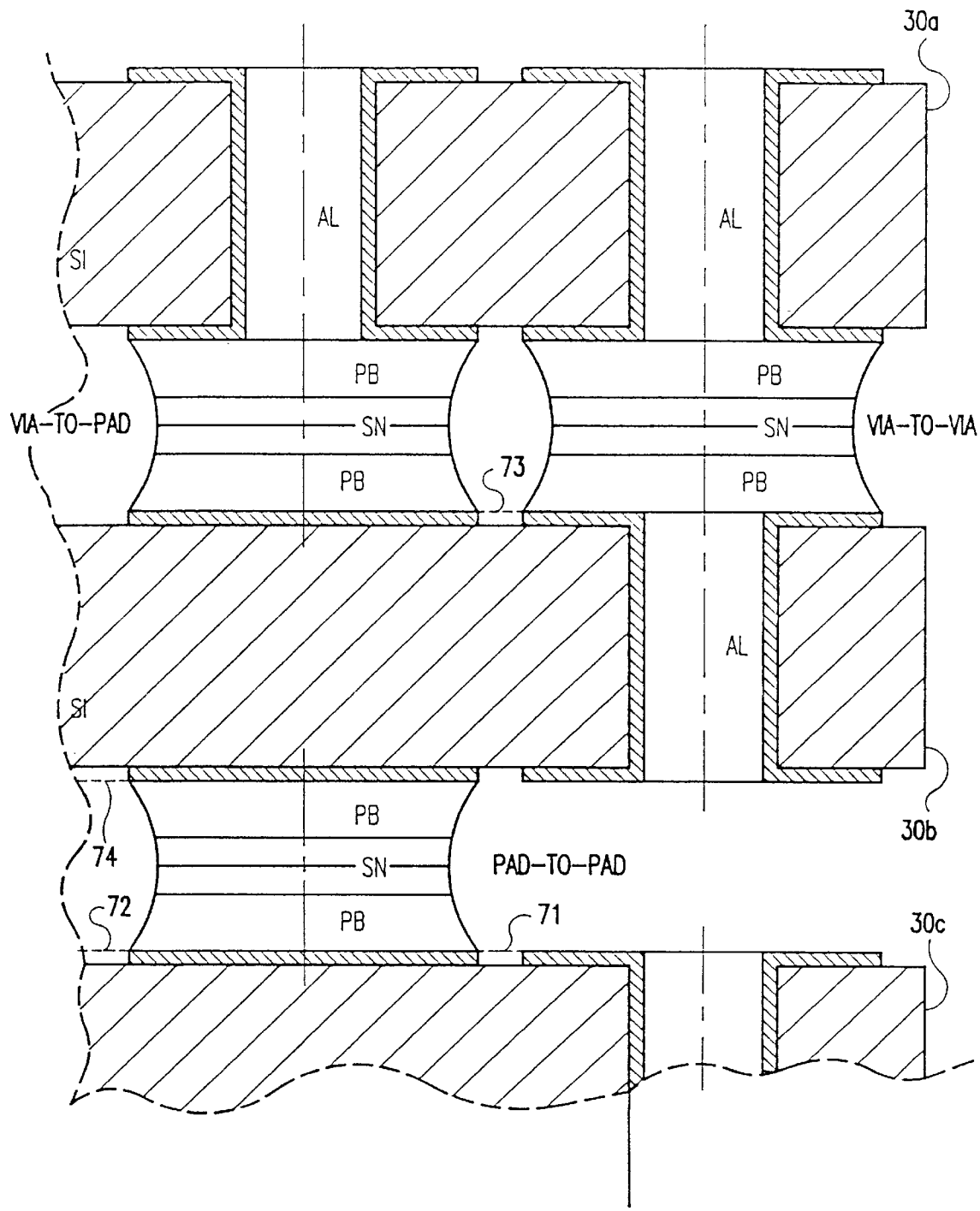
FIG. 7 shows, in cross-section, a representative stack of three stacked chips with connections formed between different combinations of pads and vias in accordance with the invention.

FIG. 7 shows similar TLP connections made at respective locations on any number of chips (e.g. 30A, 30B and 30C) and between combinations of vias and pads to form pad-to-pad and via-to-pad connections as well as via-to-via connections as discussed above in regard to FIG. 6. The TLP processes and metallurgical effects are identical in each of these types of connections and the description thereof need not be repeated. It should be noted, however, that the melting point of the lower melting point metal is preferably not exceeded sufficiently or for a period of time sufficient to allow liquefaction of significantly greater amounts thereof than is necessary to form the connection. Therefore, even if metallized through holes are not filled, the preform or deposit does not deform to allow material to be displaced into the vias or through holes.

It should also be recognized that since pads and/or surface deposits 33 surrounding vias can be connected at will, as shown by dashed lines 71, 72, by suitable patterning of surface metallization (e.g. with masked deposition or patterned etching or the like) any two or more points on any chip can be connected by patterned metallization on any other or any combination of other chips, such as the connection shown by a dashed line at 73, and such connections will usually be far shorter than equivalent connections made through the use of lead frames since such connections need not extend beyond or even to the edges of any chip.

Additionally, it should be understood that the formation of pads and connections may readily be accomplished on both sides chips (e.g. as shown by dashed line 74 and stacking of chips assumes such double-sided metallization on at least some of the chips at least to the extent of metallization 33. Further, metallization patterns can be formed in layers on a chip, in accordance with known techniques, to facilitate minimization of intra-chip connection lengths, and also for purposes of shielding. Some shielding effects will incidentally occur since the connections will be essentially enclosed within layers of semiconductor material. The reduced conductor length (e.g. to the chip thickness, often on the order of 15–20 mils, for the vias or through holes) also reduces susceptibility to electrical noise. Further, the enclosure of the connections between and within the chips prevents degradation due to environmental exposure, even during manufacture.

Figure 8A:
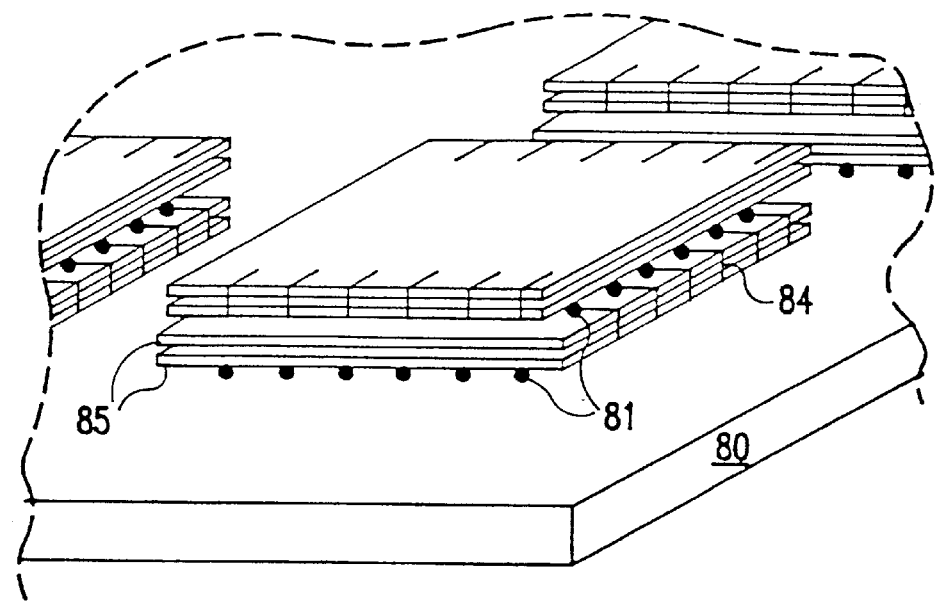
FIG. 8 shows two-chip stack sets, each set being constructed in accordance with prior art, combined using the packaging techniques of the present invention.

Having demonstrated how connections may be made through and between a plurality of chips which may be stacked together, a preferred application of that aspect of the invention particularly applicable to memory arrays will now be discussed. Incidentally, it should be noted that it is known in the art to stack two chips (e.g. 85 of FIGS. 8A and 8B having single-sided metallization (e.g. pads and connections) together with the metallized sides facing in opposite directions and with connections between the two chips made by clips or wiring at the edges thereof, as shown at 84 of FIGS. 8A and 8B. While such a structure is not preferred since it implies connections of greater length than are possible with the embodiment of the invention employing conductive vias through the chips and is not as structurally robust, the chip stacking and packaging techniques of the present invention are equally applicable thereto. The module formed of the two stacked chips effectively carries metallization on both major surfaces and such metallization would face metallization on another pair of similarly stacked chip pairs as a two chip module is stacked with other such modules and/or with single chips having double-sided metallization and conductive vias in accordance with the preferred form of the invention. More specifically, solder preforms or TLP deposits 81 can be used to make connections between chips or two-chip modules as described above as well as to carriers such as modules or boards, collectively and schematically illustrated at 80 of FIG. 8A.

Figure 8B:
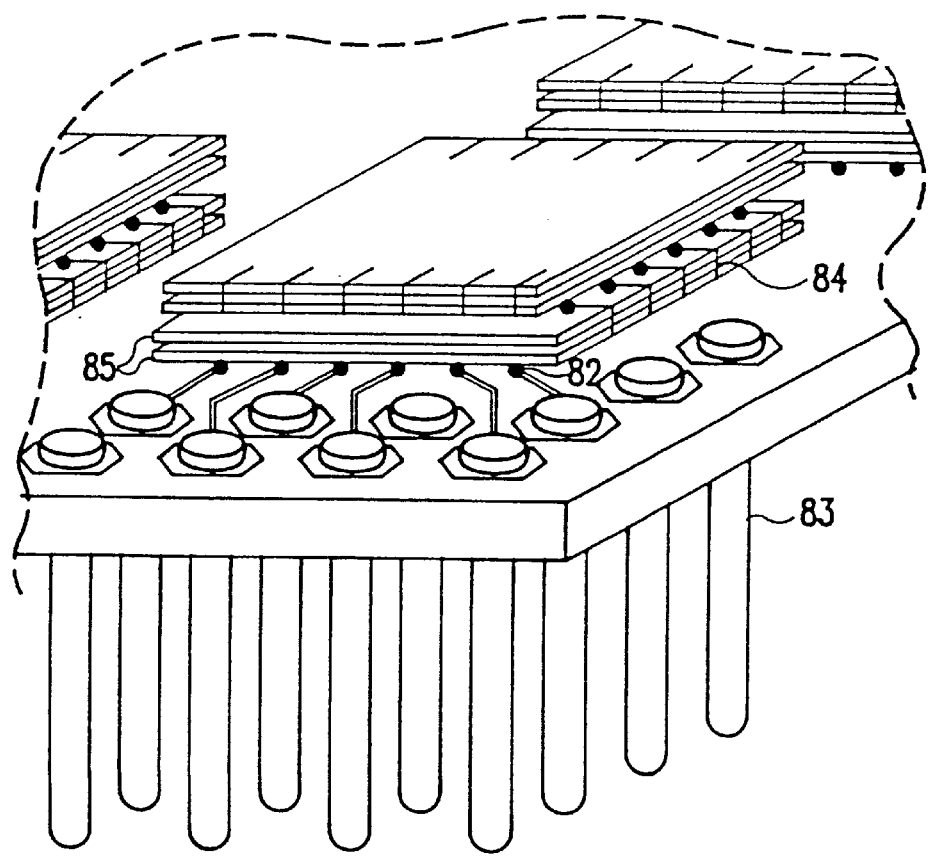

Likewise, as shown in FIG. 8B, similar preforms or TLP deposits (although the optimum sizes thereof may be different) 82 may be used to connect chip stacks in accordance with the invention to package connection structures such as pins 83. Particularly with this latter structure, high capacity memories which have previously required large single or double-sided cards may be fabricated in a modular stack package having a small "footprint" which is suitable for installation on a card or board to increase the capacity of such a module or board beyond a capacity possible prior to the present invention. Thus the capacity of a memory card may be greatly increased by installation of a plurality of such stack packages on one or both sides of a single card.

Figure 9A:
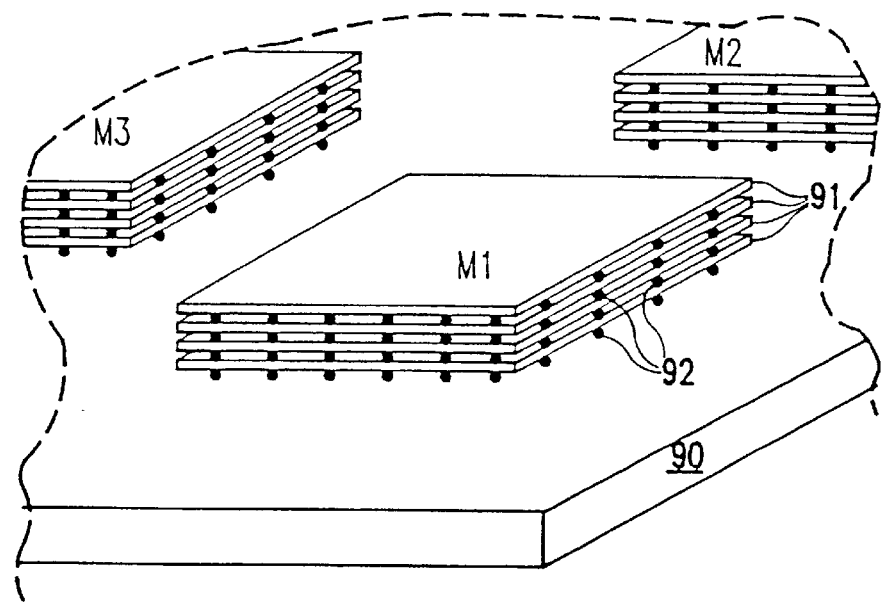
FIG. 9 shows the preferred embodiment of the present invention, having potentially large numbers of chips joined in stacks.
Figure 9B:
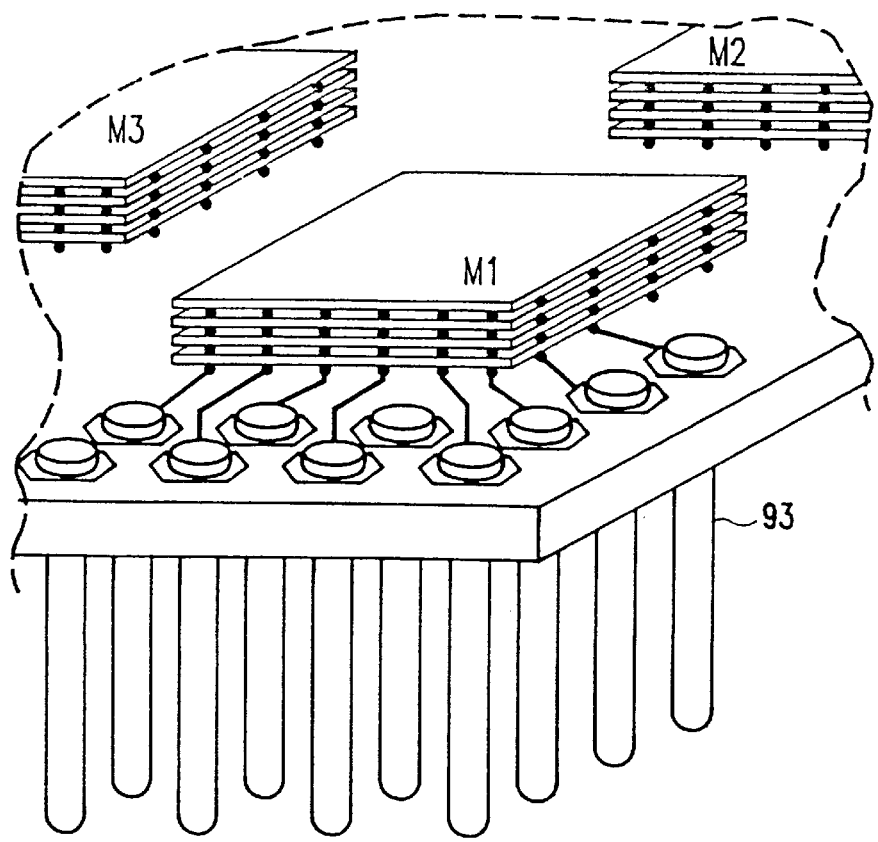

Similarly, in the preferred form of the invention shown in FIGS. 9A and 9B, stacks (e.g. M1, M2, M3, . . . ) of potentially large numbers of chips 91 can be joined together and interconnected with preforms or TLP solder deposits 92 as well as be connected to and mounted on carrier 90 or attached to package connection structures such as pins 93 to thereby form large capacity memories or other types of integrated circuits in a package having a very small footprint and suitable for mounting with other modular stack packages on a board or other carrier of convenient form.

Figure 10:
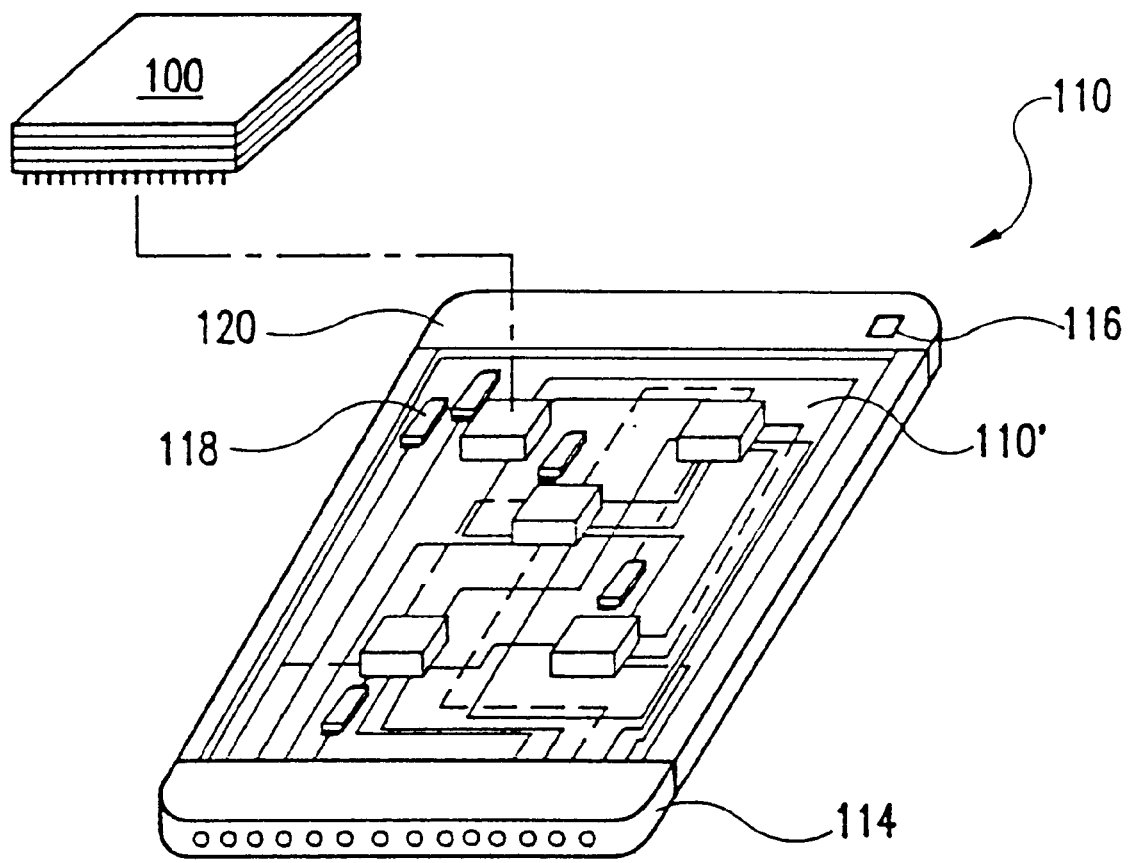
FIG. 10 shows use of chip stack packages in an exemplary high capacity memory card structure in accordance with the present invention.

For example, as shown in FIG. 10 illustrating a preferred form of a high capacity memory package (with cover removed) 110, a plurality of stack packages 100 may be mounted on one or both sides of a single carrier 110' together with additional (e.g. MSB) decoder structure or other circuits 118 (and, optionally a stand-by power supply for maintaining stored signals in a non-volatile manner when disconnected from a computer system) which is, itself, provided with a connection structure 114 of any convenient form and which is not critical to the practice of the invention, by which it may be easily connected to or disconnected from a computer system, potentially in much the same manner as the familiar floppy disk. If a large capacity "floppy disk" is emulated in such a manner, other features such as a closeable write-protect window 116 can be provided.

Further, since large numbers of chips may be packaged together in a stack package prior to mounting on the carrier, problems associated with differences in coefficient of thermal expansion (CTE) of materials are minimized within each stack package and the effective chip to plastic ratio is substantially reduced as may be seen from the relatively widely spaced mounting of stack packages on the carrier. A difference in thermal expansion between the carrier and stack packages is even more easily accommodated by the mounting of the stack packages. Low stand-off height is also of reduced concern due to the mounting of the stack packages and thinness of the overall memory package can be easily maintained by the compactness of the stack packages.

Protection from other environmental conditions such as moisture, vibration and the like is largely provided by the stack packages themselves. For example, bending or flexure of the carrier is much more easily accommodated without bending, inelastic deformation of connections or other damage to the stack packages mounted thereon.

Since any number of chips may be stacked and any number of stacks (sometimes referred to as memory cubes) provided in a single stack package and as many stack packages as conveniently sized card area allows (on one or both sides) may be mounted on a card, a potentially removable and easily transportable memory module of very large capacity (e.g. 10 Megabytes or more) can be provided in a package which can be handled and used much in the manner of the well-known floppy disk. Thus, the invention provides a structure whereby large memory can be provided in a removable card format while overcoming virtually all of the drawbacks of known memory card structures. Moreover, due to the reduced connection lengths within each of the stack packages included in the memory card structure, the memory is of improved electrical performance (e.g. access speed) and noise immunity while increased memory capacity for a package of given size is achieved.

Figure 11:
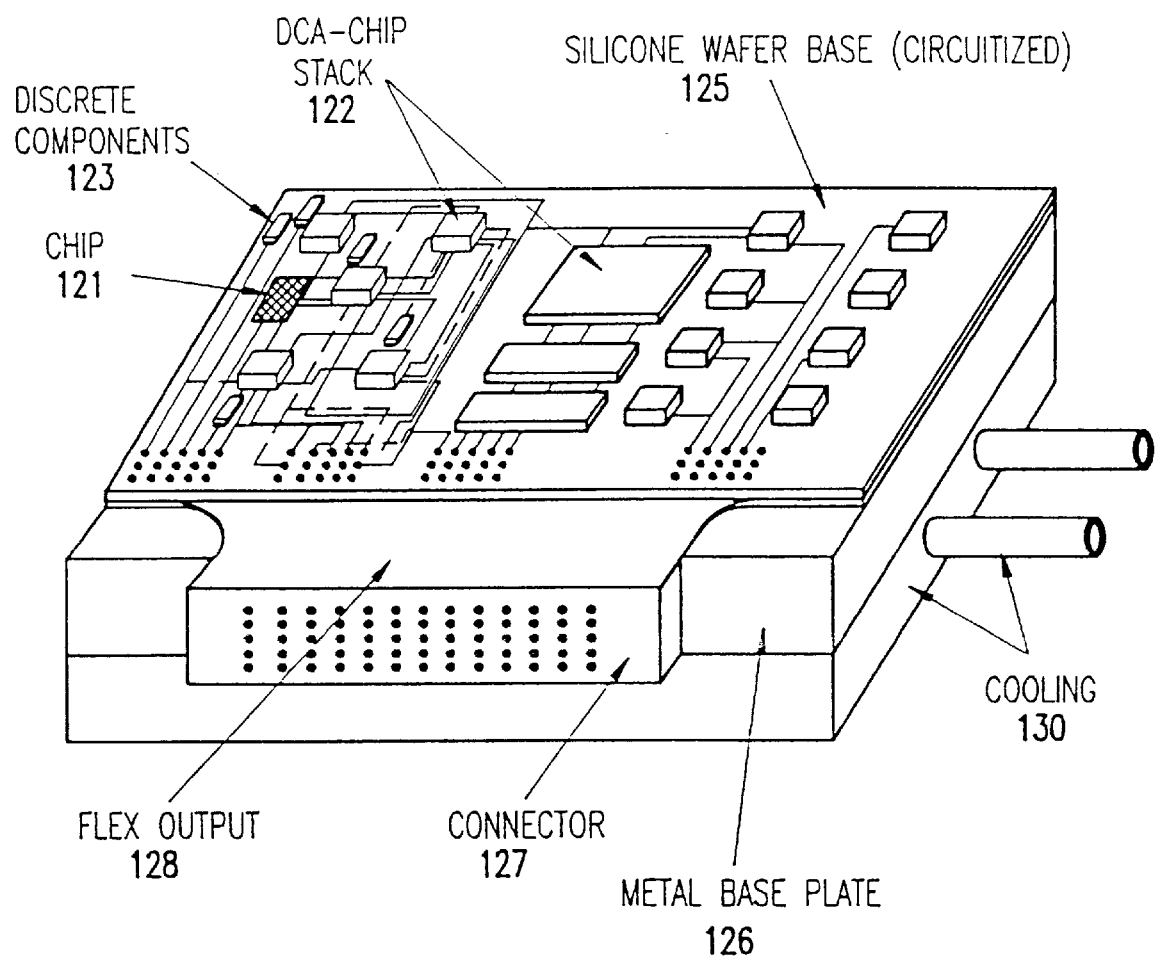
FIG. 11 shows a thermal conduction module composed of chip stacks constructed in accordance with the present invention.
Figure 12:
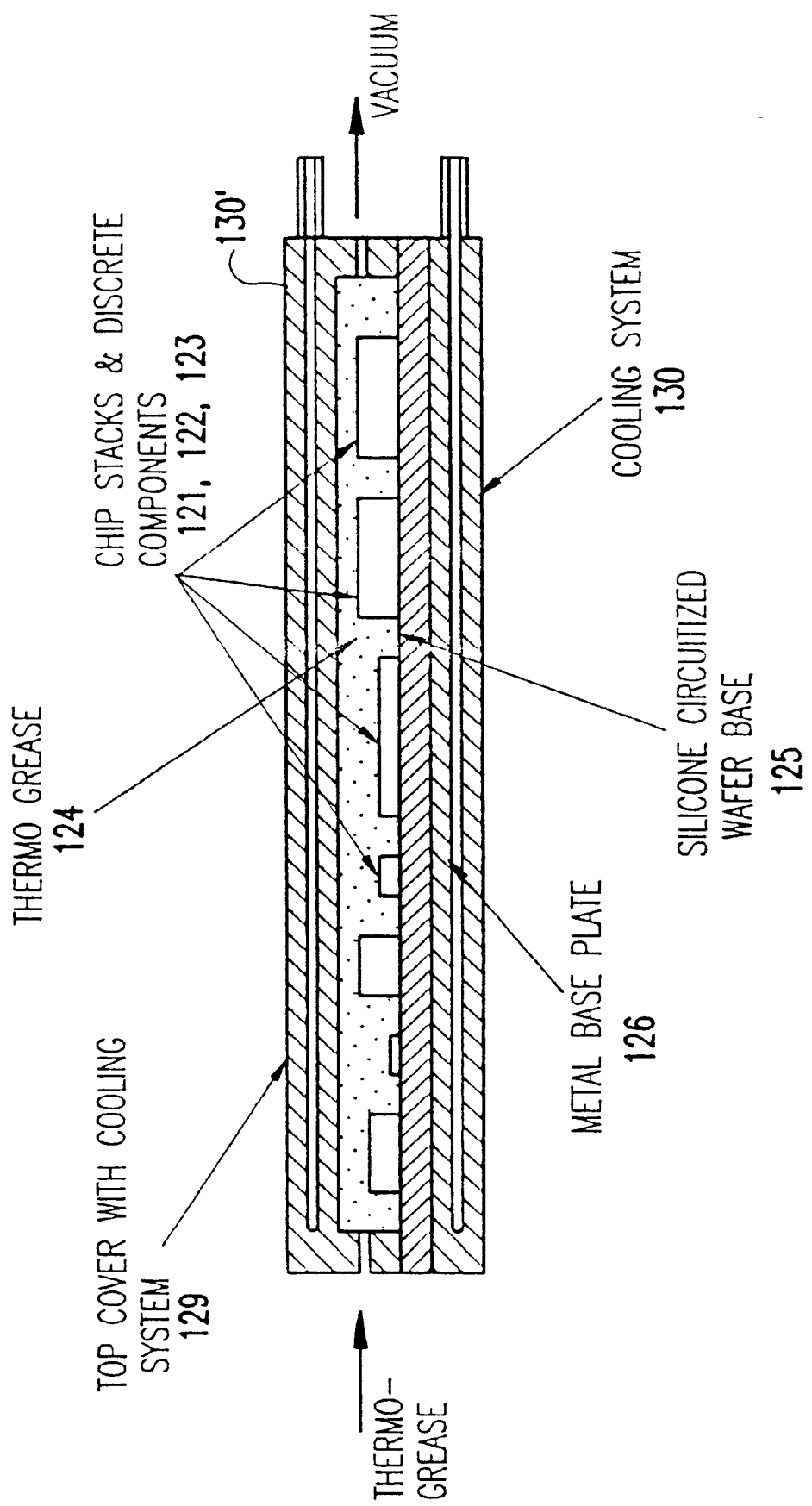
FIG. 12 shows a cross-section of another thermal conduction module of similar to that of FIG. 11.

Another implementation of these features of the invention will now be described with reference to FIGS. 11 and 12. Chips 121, chip stacks 122 and discretes 123 which have been assembled and tested are mounted on a circuitized silicon carrier 125 (which may also be stacked in the manner of chips, as described above) using conventional attachment methods such as solder, electrically conductive adhesive or transient liquid phase (TLP) metallurgical joining, as described above. Because of the direct mount to a silicon carrier, the coefficients of thermal expansion (CTE) are matched and high joint interconnect reliability is thereby achieved. Circuitry on the silicon carrier is patterned using conventional art for semiconductor fabrication, and is generally far less complex than functional chip circuitry. The silicon carrier is bonded to a metal cold plate 126 which conducts heat away, and to which is mounted a connector 127 whose leads are joined to the circuitry of the silicon carrier 125, preferably by a flexible output plate 128 joined to the edge of the silicon carrier 125. The flexible output plate 128 insulates the silicon carrier 125 from stress due to insertion and extraction of connector 127. The cold plate 126 is constructed to match the CTE of the silicon carrier (e.g. copper-invar-copper), or is bonded to the silicon carrier 125 using low modulus stress absorbing adhesive. A cooling system 130 may be used to remove heat from the device. A second cold plate 129, as shown in FIG. 12, may be mounted above the silicon carrier 125 and joined with cold plate 126 at the edges so as to enclose silicon carrier 125 and components (121, 122, and 123) mounted thereon, as shown in FIG. 12. The cavity thus formed may be filled with compliant thermal material or fluid 124 (e.g. thermal grease) to enhance heat transfer. A further cooling system 130' may thus be added to increase cooling efficiency and minimize temperature excursion of the carrier 125 and circuits mounted thereon, particularly since heat transfer to cooling system 130' is not impeded by thermal resistance of silicon carrier 125 although heat transfer through the fluid or thermal grease must still be accounted for.

While a card format and application, with or without external cooling, may advantageously exploit the meritorious effects of the invention to obtain increased capacity and performance from memory structures currently in use, a memory card embodiment is not optimal since connection length is constrained by the card structure and, hence, not minimized. Further, the memory package remains of less than optimally convenient size and thickness and less than optimally protected from environmental effects, particularly if a battery is included to prevent volatility of stored data. In this latter regard, the increased weight and density of a battery may, itself, give rise to problems of flexure, bending and connection (e.g. metallization, solder, etc.) during any acceleration or vibration.

Figure 13A:
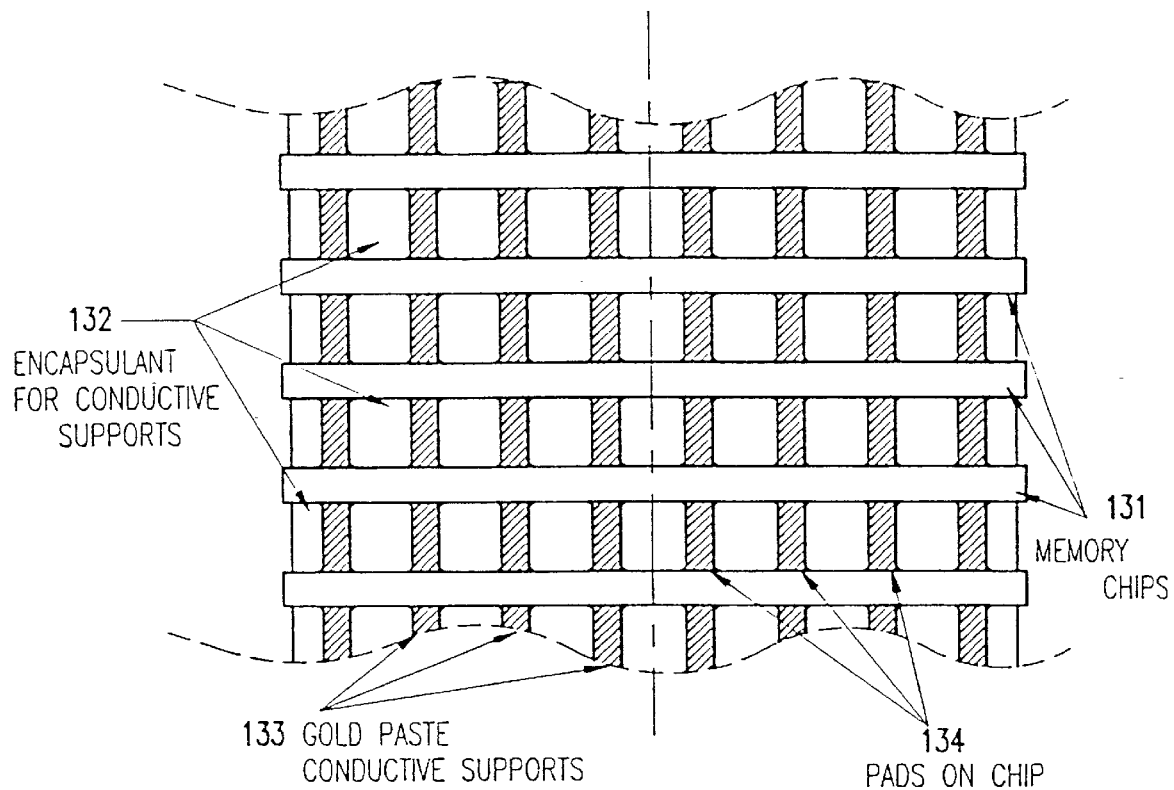
FIG. 13 shows a flex connected memory chip stack constructed in accordance with the present invention.
Figure 13B:
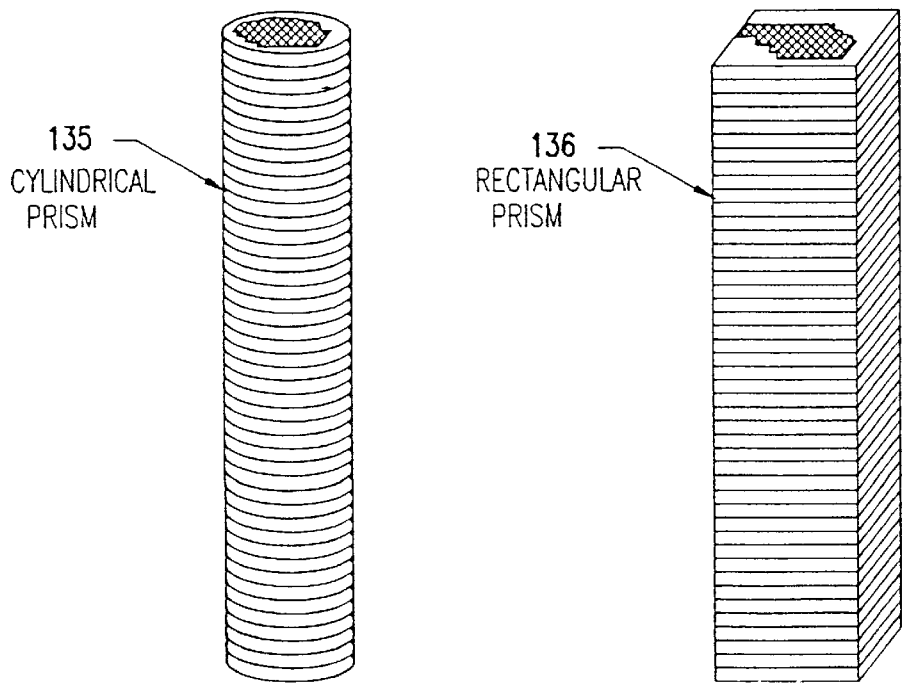
Figure 14:
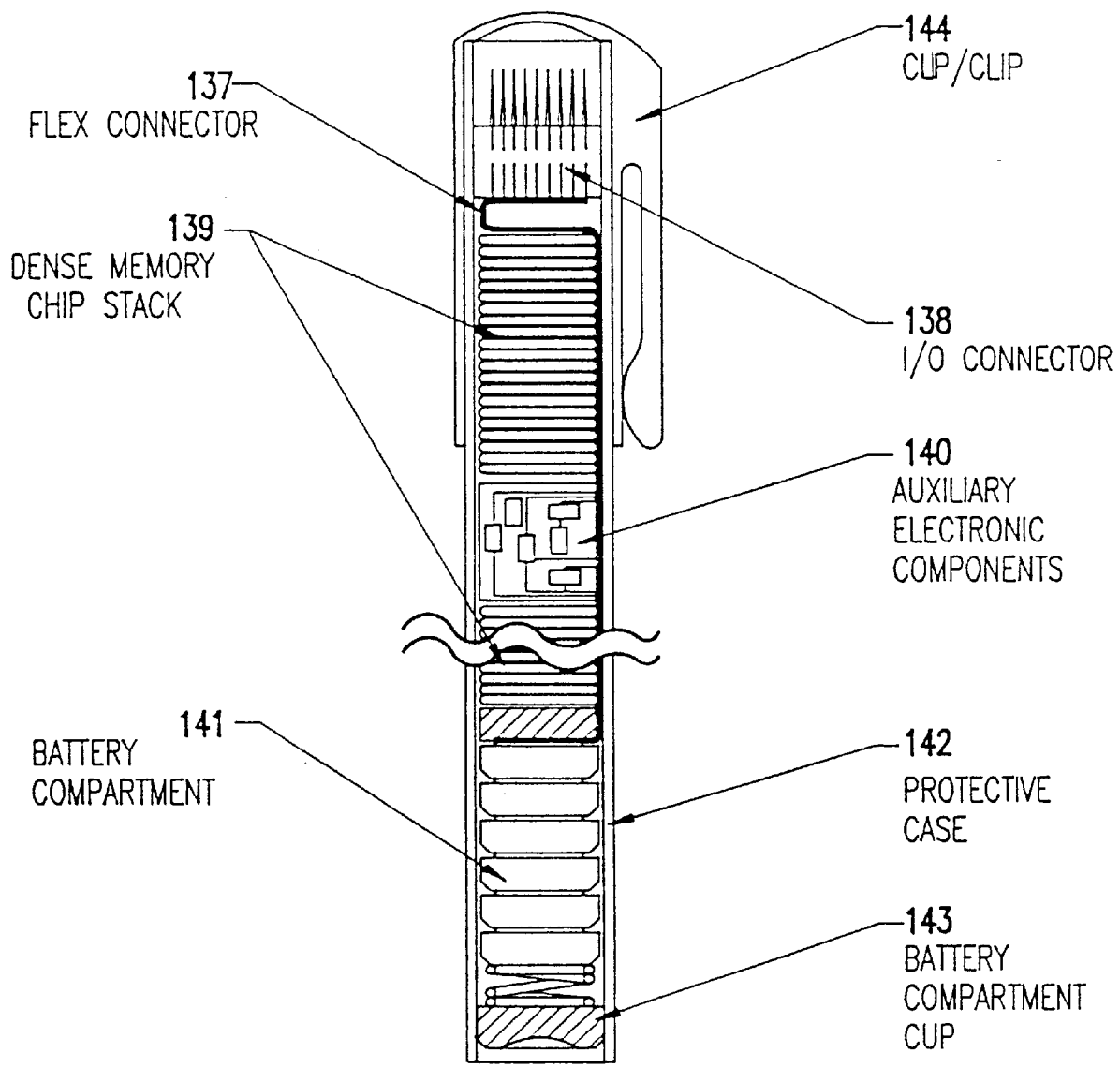
FIG. 14 shows a cylindrical pocket memory package using a flex connected memory chip stack from FIG. 13

Accordingly, a preferred package for implementation of the invention in a removable memory device will now be explained with reference to FIGS. 13A, 13B and 14, which show a high density memory stack and generally prism shaped (e.g. cylindrical) pocketable memory package. Memory chips 131 are usually only 300 to 600 microns in thickness, and are stacked and bonded to each other by a thermal expansion compatible electrically conductive interconnection medium 133 (such as noble metal filled conductive adhesive encapsulated in an insulating film 132 whose holes, corresponding to metallized pads 134, are filled with a conductive medium which has been screen printed, or preferably TLP joints) which attach to metallized pads 134 on the surface of the chips 131 and provide a suitable mechanical and electrical connection between memory chips 131. Thus joined, the chips comprise a prism shaped stack which such as a cylindrical column 135 or rectangular column 136 as shown in FIG. 13B. These are examples only. In general, the chips 131 may be designed conformably to any convenient packaging cross section, the cylinder shown in FIG. 14 being the simplest and preferred embodiment.

Memory stacks (135, 136) assembled in this manner largely avoid use of space consuming carriers, cables and connectors. Specifically, in the preferred embodiment, other associated surface mount components 140 are attached on a flexible carrier 137, to which the memory modules 139 and an I/O connector 138 are also attached. The carrier 137 is then rolled to form the tubular memory module subassembly as shown in FIG. 14. This subassembly is then inserted into cylindrical housing 142, one end of which serves as a battery compartment 141 capped and preferably closed by a removable spring loaded end cap 143 allowing convenient removal of the battery for replacement. At the other end of housing 142 there is a removable cap 144 that exposes connector 138 to facilitate computer interface but serves to protect connections 138 when the memory module is not inserted in a processor or memory access device of reader associated therewith. This assembly thus provides protection for the memory medium and input/output connections thereto while providing a robust mechanical construction for a memory of high capacity. Further, volatility of data can be avoided by inclusion of batteries for stand-by power in a fashion which does not compromise the robustness of the structure. Such a removable memory package is of convenience since it can be carried in a pocket in a well-accepted way with the added convenience and security of a clip or other facility for securing the package to clothing, notebooks and the like.

Figure 15:
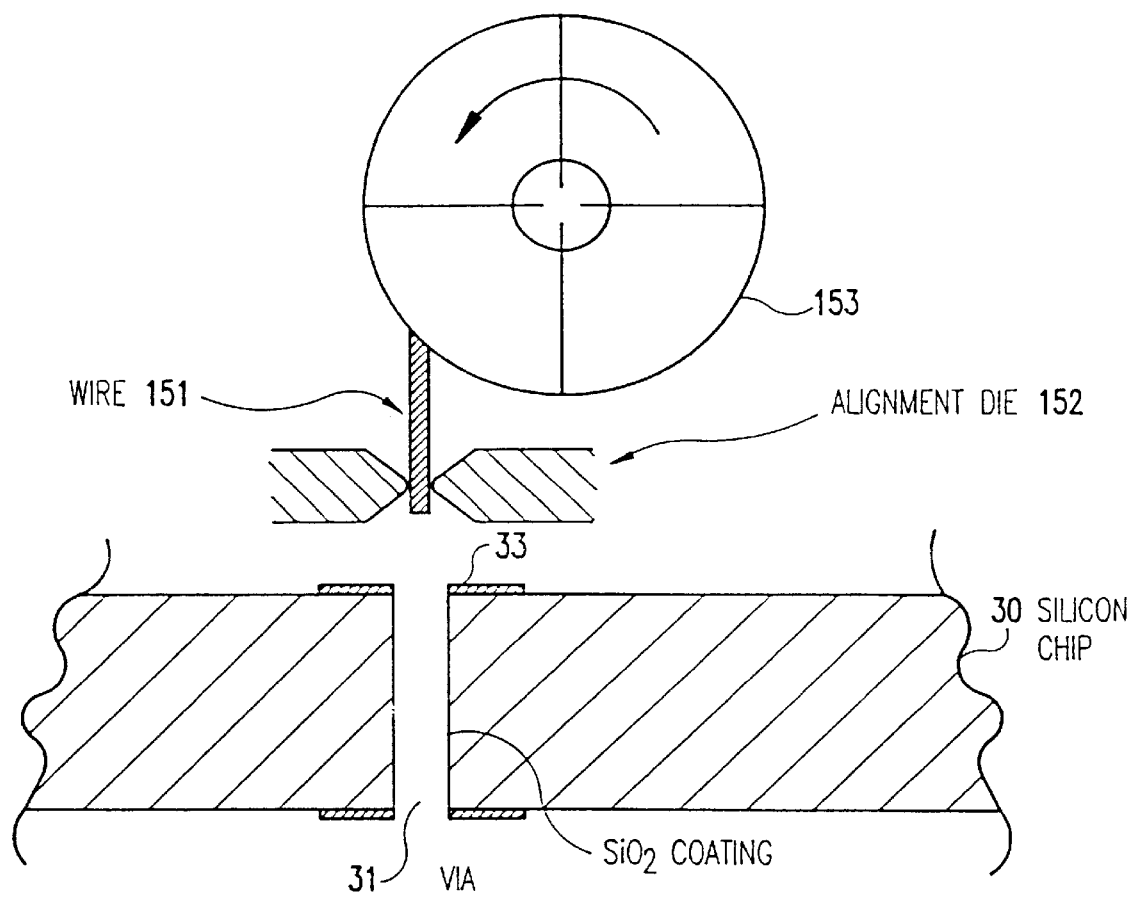
FIG. 15 shows a wire aligned for insertion through the hole in a chip in accordance with the invention.

Having described numerous variations and applications of the invention utilizing connection made through an integrated circuit chip, some additional techniques of implementing the invention at the chip or carrier level will now be described with reference to FIGS. 15–21. For example, FIG. 15 schematically shows apparatus for making a particularly robust and high conductivity connection between opposite surfaces of a chip 30 having an aperture 31 and metallization flange 33 formed as discussed above. A wire 151 is aligned with aperture 31 by alignment die 152 as it is unwound from a wire dispensing apparatus 153, illustrated as a spool. Such very fine wires of a diameter smaller than the apertures 31 produced in accordance with the invention and suitable apparatus for handling the same with extremely high precision are known and available in the art. Such wires are often formed of gold because of its high conductivity and ductility and are referred to as "yellow wires" when used for carrying out so-called engineering changes in modular circuit packages or making connections from very small pads on semiconductor chips or carriers to connection pads or pins of a circuit package, MLM, or the like.

Figure 16:
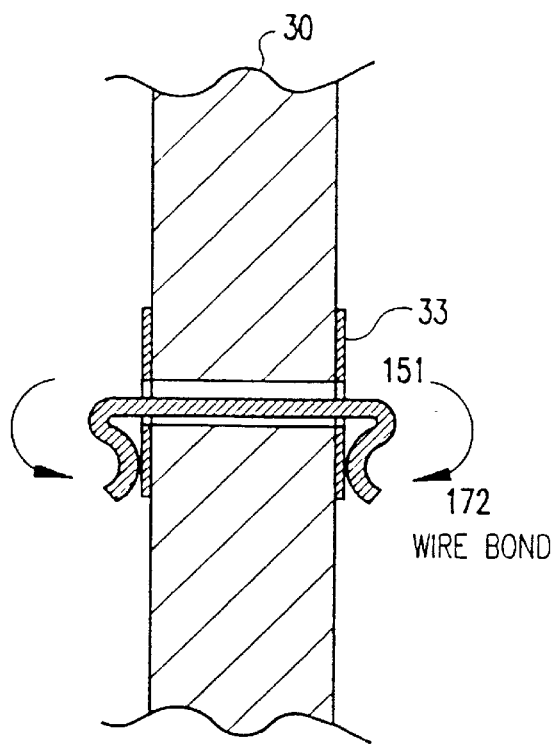
FIG. 16 shows the wire of FIG. 15 bonded to both chip surfaces.
Figure 17:
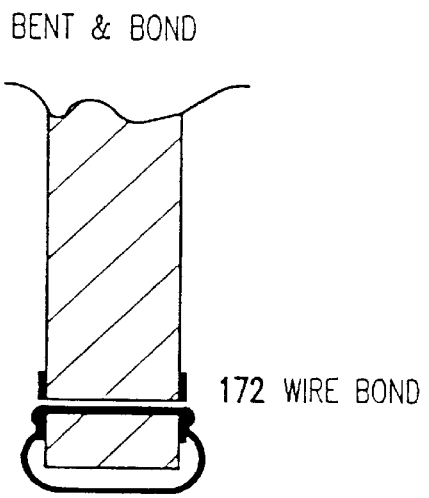
FIG. 17 shows a wire bonded to both chip surfaces but routed around an edge of a chip in accordance with a variation of the invention.
Figure 18:
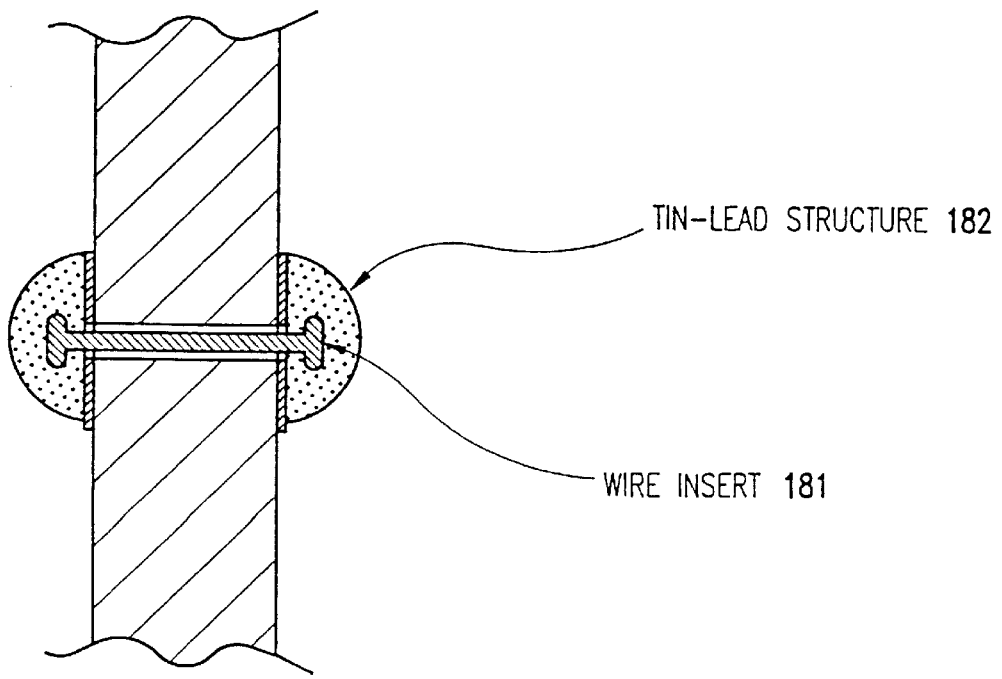
FIG. 18 shows the wire of FIG. 15 bonded to the chip surfaces with solder.

As shown in FIG. 16, dispensing the wire 151 through alignment die 152 accomplishes insertion through the aperture in the chip. Once the wire 151 is so inserted, it may be bent to contact the metallization flange surrounding the aperture and/or any other pad or metallization flange of connection pad on the chip, bonded thereto by solder, welding or the like and trimmed to length. Alternatively, as shown in FIG. 18, the chip via aperture 31 can be filled with a tin-lead (or other low temperature melting point metal or conductive paste) structure 182 to reinforce the wire and to augment the conductivity of the wire insert 181 (which, in this case, need not be bent) and any through-hole metallization which may have been formed. In this case, also, the tin-lead or other conductive structure achieves mechanical and electrical bonding of the wire insert to the conductive flanges 33. Of course, the filling can be done by vacuum or pressure or by capillary action, as noted above; the latter effect being enhanced by the presence and solder wettability of the wire.

When the via is formed, as preferred, near the edge of a chip or carrier, as illustrated in FIG. 3, current carrying capacity can be enhanced if desired or required by further extending the wire 151 of FIG. 16 or wire insert of FIG. 18 around the edge of the chip or carrier to form a second connection between flanges 33; effectively halving the small resistance of the through hole connection. While this connection forms a loop, the area and resistance of the connection are very small and inductive noise generation is negligible for applications which are not in the presence of magnetic fields of sufficient strength to induce noise in other portions of the processor system.

Figure 19:
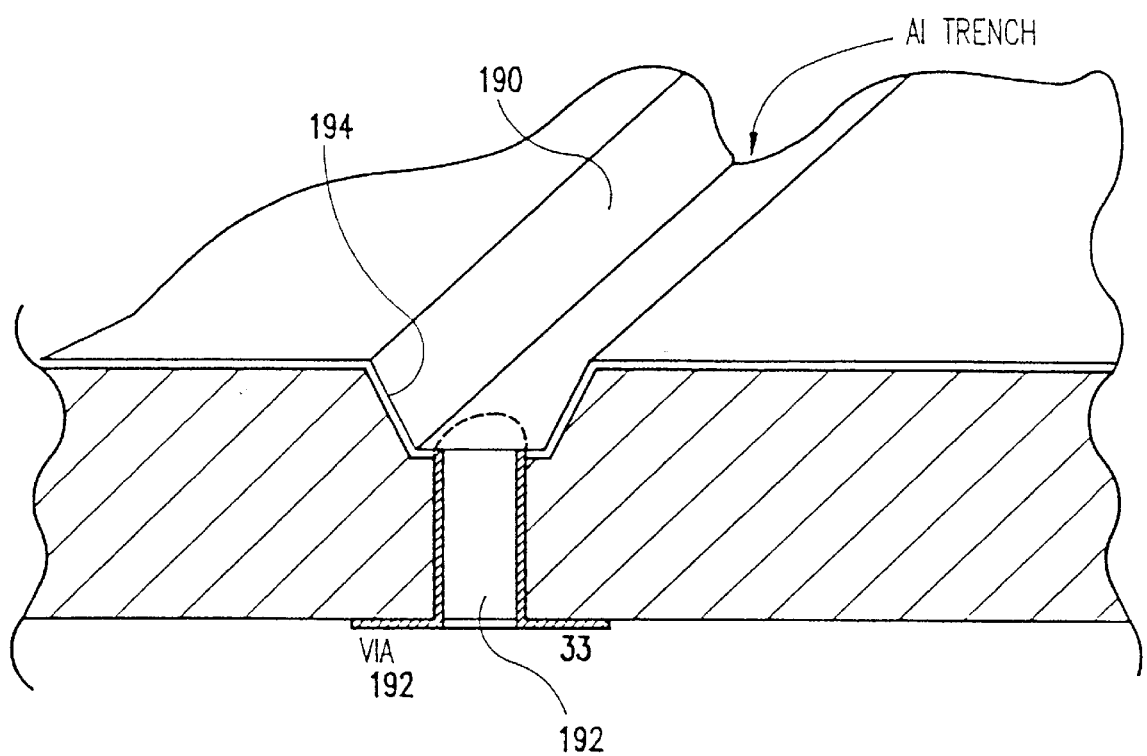
FIG. 19 shows a metallized trench on a surface of a chip and connected to a via.

FIG. 19 shows a variation on the well and hole form of aperture in a chip or carrier, discussed above, in which the large diameter aperture or countersink is formed as a trench 190 which can contain metallization (e.g. aluminum) 194 to function as a recessed conductor or connection flange, such as flange 33, which is formed on the opposite surface of the chip or carrier. The through hole or well 192 is thus of a length less than the thickness of the chip or carrier which can be exploited in numerous ways (e.g. reduction of via length or aspect ratio and resulting resistance, increased ease of via filling, reduction of conductor resistance, recessing or shielding of other components, etc.) which will be apparent to those skilled in the art from this description and illustration of an exemplary structure, of course, such trenches may be formed on both surfaces of the chip or carrier, if desired and connected by a conductive via in the same fashion. Particularly useful applications for such trenches include provision of orthogonal connector planes on opposite sides of the chip and providing recesses for wire bonding such as that shown in FIGS. 16–18 if subsequent planarization of the chip is required or desired for lithographic process purposes, for example.

Another variation of the well and hole form of aperture is illustrated in FIG. 20. In this case, a doped region 201 of the chip or carrier is substituted for the smaller diameter hole and drilling of the smaller hole is not necessary. Alternatively, doped semiconductor material can be used, by deposition, implantation, diffusion, etc., instead of a metal coating on the interior of the via or any portion thereof. This variation of the invention allows application of the principles thereof to smaller structures (since the larger diameter well 192 can be formed at minimum laser spot size) and is particularly useful for providing a back-surface connection of high conductivity to a doped region which may constitute a portion of a transistor, capacitor, inductor, or the like which may be formed on the chip or carrier.

These exemplary variations of the invention may be formed in combination and with greatly differing and/or opposite relative sizes of the well and hole structure. For example, as shown in FIG. 21, a microhole or trench 220, possibly including metallization 224, can be formed much smaller than via 222. As illustrated, proportions can differ in the direction of the via, as well, and it is generally preferable that the larger diameter well 192 extend more than half of the thickness of the wafer up to just less than the full wafer thickness.

While the invention has been described in terms of a single preferred embodiment, those skilled in the art will recognize that the invention can be practiced with modification within the spirit and scope of the appended claims.

What is claimed is:

1. A process for making a plurality of laser drilled chips for stacking, comprising the steps of:

produced a wafer having a first semiconductor surface;

covering said first semiconductor surface with a protective coating;

drilling holes with a laser into said wafer;

making said holes electrically conductive through said wafer to from vias through said wafer;

forming interconnecting conductive supports on said wafer at a plurality of said vias, said conductive supports being transient liquid phase (TLP) joints including a conductive paste; and dicing said wafer into a plurality of chips.

2. A process as in claim 1, wherein said wafer has planar and parallel first and second surfaces, at least the first of said surfaces being a semiconductor surface, said holes being drilled in a direction substantially perpendicular to said planar surfaces, further comprising the steps of:

forming microelectronic circuits on said first semiconductor coated surface;

forming an array of first electrical connections on said first semiconductor coated surface; and forming an array of second electrical connections on said second surface.

3. A process as in claim 2, wherein the step of forming an array of first electrical connections includes the steps of, dry depositing a layer of aluminum on said first surface;

dry depositing a layer of copper over said layer of aluminum;

dry depositing a layer of chromium over said layer of copper;

photolithographically removing said deposits of aluminum, copper and chromium over selected areas on said first surface thereby providing separate three-layer metal pads, a plurality of said pads being at said via holes.

4. A process as in claim 1, wherein the step of forming interconnective TLP conductive supports includes the steps of, dry depositing 97/3 Pb/Sn solder over said first surface;

photolithographically removing said deposits of solder over selected areas on said first surface thereby providing separate pads of solder, a plurality of said pads being over said first connections at said via holes, said plurality of said solder pads having a circumference extending outward beyond said first connections over a part of said first surface;

reflowing said solder pads to form solder bumps over said first connections.

5. A process as in claim 2, wherein said protective coating is a water soluble material, and further comprising the step of removing said coating after said drilling step, said removing step using agitated water and serving to clean from said wafer debris produced by said drilling step.

6. A process as in claim 2, wherein said protective coating is a permanent passivation layer and the holes are drilled after formation of electronic components on said wafer.

7. A process as in claim 1, wherein said laser drilling step further comprises the step of directing a laser through beam splitting optics to simultaneously drill a plurality of said holes.

8. A process for making a plurality of laser drilled chips for stacking, comprising the steps of:

producing a wafer having a first semiconductor surface;

covering said first semiconductor surface with a protective coating;

drilling holes with a laser into said wafer:

making said holes electrically conductive through said wafer to form vias through said wafer;

forming an interconnecting conductive supports on said wafer at a plurality of said vias;

dicing said wafer into a plurality of chips, wherein said wafer has planar and parallel first and second surfaces, at leat the first of said surfaces being a semiconductor surface, said holes being drilled in a direction substantially perpendicular to said planar surfaces, said process further comprising:

forming microelectronic circuits on said first semiconductor coated surface;

forming an array of first electrical connections on said first semiconductor coated surface; and forming an array of second electrical connections on said second surface, and wherein said laser drilling step includes the steps of:

drilling wells of a first diameter through more than half of the wafer thickness from one of said wafer surfaces; and drilling holes of a second diameter from the other of said wafer surfaces, said second diameter being substantially smaller than said first diameter.

9. A process for making a stack of laser drilled chips, including chips having a first and a second surface, a first and a second array of connections on said respective first and second surfaces, and interconnecting conductive supports on a plurality of said connections, said supports having electrical and mechanical properties modifiable by application of heat, said chips being designed for ordered arrangement in a stack such that at adjoining surfaces between an upper chip and a lower chip in said stack, said vertical interconnecting conductive supports are positioned between connections of said upper chip and a corresponding confronting in mirror image arrangement on said lower chip, comprising the steps of:

positioning said chips vertically in accordance with said ordered arrangement;

aligning said chips horizontally in accordance with said mirror image arrangement;

controlling temperature of said positioned and aligned chip stack, so as to produce reliable mechanical and electrical transient liquid phase (TLP) joints at said vertical interconnecting conductive supports.

10. A process for packing an electronic circuit design, comprising the steps of:

making a plurality of laser drilled chip stacks in accordance with said designs, each of said stacks being made in accordance with steps that include forming an interconnecting conductive support between at least two chips in said stack, said conductive support being a transient liquid phase (TLP) joint including a conductive paste;

forming a silicon wafer carrier, said carrier having an I/O strip along at least one edge;

patterning said carrier with circuitry in accordance with said design; and attaching to said carrier a plurality of said chip stacks.

11. A process for making a thermal conduction module, comprising the steps of:

forming a plurality of laser drilled semiconductor chip stacks, at least one of said chip stacks comprising at least two chips and a connection formed between said at least two chips at a location within respective peripheries of said at least two chips, said forming step including forming a transient liquid phase (TLP) joint including a conductive paste at said connection;

forming a carrier of a material having a coefficient of thermal expansion substantially equal to a coefficient of thermal expansion of said chip stacks, said carrier having an I/O strip long at least one edge;

patterning said carrier with circuitry designed to allow communication between said chip stacks;

electrically connecting at least one said laser drilled chip stack to said carrier; and attaching to said module means for dissipating heat generated by operation of said chip stacks and associated circuitry.

12. A method as recited in claim 11, wherein said carrier and said chip stacks are formed of silicon.

13. A process as in claim 1, wherein electrically conductive paste includes particles of at least one of a noble metal and a transient liquid phase solder material.

14. A process as in claim 1, wherein said forming step includes forming interconnecting conductive supports at a plurality of said vias, each of said conductive supports being a TLP joint.

15. A process as in claim 1, wherein said interconnecting conductive supports form at least one of a pad-to-pad interconnection, via-to-pad interconnection, and a via-to-via interconnection.

16. A process as in claim 1, wherein said step of making said holes electrically conductive includes forming a metallization layer along the entire inner surface of each of said holes.

* * * * *